(12) United States Patent
Olsen

(10) Patent No.: US 9,712,185 B2
(45) Date of Patent: Jul. 18, 2017

(54) SYSTEM AND METHOD FOR IMPROVED FRACTIONAL BINARY TO FRACTIONAL RESIDUE CONVERTER AND MULTIPLER

(71) Applicant: Eric B. Olsen, Las Vegas, NV (US)

(72) Inventor: Eric B. Olsen, Las Vegas, NV (US)

(73) Assignee: Olsen IP Reserve, LLC, Henderson, NV (US)

(*) Notice: Subject to any disclaimer, the term of this patent is extended or adjusted under 35 U.S.C. 154(b) by 283 days.

(21) Appl. No.: 14/579,918

(22) Filed: Dec. 22, 2014

(65) Prior Publication Data

US 2015/0106414 A1 Apr. 16, 2015

Related U.S. Application Data

(63) Continuation-in-part of application No. 13/475,979, filed on May 19, 2012, now Pat. No. 9,081,608.

(60) Provisional application No. 61/919,730, filed on Dec. 21, 2013.

(51) Int. Cl.
*H03M 7/18* (2006.01)
*G06F 7/72* (2006.01)

(52) U.S. Cl.
CPC .............. *H03M 7/18* (2013.01); *G06F 7/72* (2013.01); *G06F 7/729* (2013.01)

(58) Field of Classification Search
CPC ............ H03M 7/18; G06F 7/72; G06F 7/729
See application file for complete search history.

(56) References Cited

U.S. PATENT DOCUMENTS

| | | | | |
|---|---|---|---|---|
| 4,281,391 A * | 7/1981 | Huang | .................... | H03M 7/18 341/83 |
| 4,588,980 A * | 5/1986 | Bernardson | ............. | H03M 7/18 341/144 |
| 5,117,383 A * | 5/1992 | Fujita | ..................... | G06F 7/729 708/491 |
| 7,523,151 B1 * | 4/2009 | Mellott | ................... | H03M 7/18 708/491 |

* cited by examiner

*Primary Examiner* — Chuong D Ngo
(74) *Attorney, Agent, or Firm* — Lightbulb IP, LLC

(57) ABSTRACT

Methods and systems for residue number system based ALUs, processors, and other hardware provide the full range of arithmetic operations while taking advantage of the benefits of the residue numbers in certain operations.

3 Claims, 25 Drawing Sheets

| Register | Cycle 0 | Cycle 1 | Cycle 2 | Cycle 3 | Cycle 4 | Cycle 5 | Cycle 6 | Cycle 7 | Cycle 8 | Cycle 9 |
|---|---|---|---|---|---|---|---|---|---|---|
| 511 → $M_0$ | 1 | 2 | 3 | 5 | 7 | 1 | 1 | 1 | 1 | 1 |
| 512 → $M_1$ | 1 | 1 | 2 | 3 | 5 | 7 | 1 | 1 | 1 | 1 |
| 513 → $M_2$ | 1 | 1 | 1 | 2 | 3 | 5 | 7 | 1 | 1 | 1 |
| 514 → $M_3$ | 1 | 1 | 1 | 1 | 2 | 3 | 5 | 7 | 1 | 1 |
| 515 → $A_0$ | 5 | A | E | 6 | A | A | A | A | A | A |
| 516 → $C_1$ | 0 | 0 | 1 | 4 | 2 | 0 | 0 | 0 | 0 | 0 |
| 517 → $A_1$ | 5 | 5 | A | F | F | B | B | B | B | B |
| 518 → $C_2$ | 0 | 0 | 0 | 1 | 4 | 6 | 0 | 0 | 0 | 0 |
| 519 → $A_2$ | 5 | 5 | 5 | A | F | F | F | F | F | F |
| 520 → $C_3$ | 0 | 0 | 0 | 0 | 0 | 1 | 4 | 6 | 0 | 0 |
| 521 → $A_3$ | 5 | 5 | 5 | 5 | A | F | F | F | F | F |
| 522 → $D_0$ | 0 | 0 | 0 | 0 | 0 | 0 | 1 | 1 | 1 | 0 |
| 523 → $D_1$ | 0 | 0 | 0 | 0 | 0 | 0 | 1 | 0 | 0 | 1 |
| 524 → $D_2$ | 0 | 0 | 0 | 0 | 0 | 0 | 1 | 4 | 4 | 0 |
| 525 → $D_3$ | 0 | 0 | 0 | 0 | 0 | 0 | 1 | 2 | 6 | 0 |

Cycle 8: 500
Cycle 9: 510

Example Apparatus Configuration:
Q = 4 bits (hex digits)
J = 4 digits (16 bits)
F = 4 RNS fractional digits
Modulus(2, 3, 5, 7)
Clocks = F + J + 1 = 9

Round up Detection:
Since $FFBA_{16}$ > $8000_{16}$
Then round up = 1

Example Values:
Binary Input: $5555_{16}$
($5555_{16}/10000_{16}$) = .33333
Output = (1,0,4,6) = $69_{10}$
Final = (0,1,0,0) = $70_{10}$
69 + 1 = 70
70/210 = .33333

Figure 5

1551 — Approximates calculation of:
8 1/16 * 3 ¼
Actual calculation is:
4115987/$R_F$ * 1659157/$R_F$ = 13376954/$R_F$
Where $R_F$ = 2*3*5*7*11*13*17 = 510510

| 1555 Figure 15B Control Step | Extended Digits 1560 | | | | | | | Integer Range 1565 | | | | Fractional range 1570 | | | | | | | Sign Flags 1575 | | Description 1580 | Machine Value 1585 | Interpreted Value 1590 |
|---|---|---|---|---|---|---|---|---|---|---|---|---|---|---|---|---|---|---|---|---|---|---|---|
| | 61 | 59 | 53 | 47 | 43 | 41 | 37 | 31 | 29 | 23 | 19 | 17 | 13 | 11 | 7 | 5 | 3 | 2 | SM | SV | | | |
| | $E_7$ | $E_6$ | $E_5$ | $E_4$ | $E_3$ | $E_2$ | $E_1$ | $I_4$ | $I_3$ | $I_2$ | $I_1$ | $F_7$ | $F_6$ | $F_5$ | $F_4$ | $F_3$ | $F_2$ | $F_1$ | Mag | Valid | | | |
| 1556 Step 1500 | 12 | 29 | 7 | 9 | 27 | 38 | 33 | 24 | 17 | 22 | 17 | 15 | 5 | 7 | 1 | 2 | 2 | 1 | X | 0 | Operand A | 4115987 / $R_F$ | 8.0625 1581 |
| 1557 Step 1500 | 18 | 18 | 45 | 10 | 2 | 10 | 3 | 6 | 9 | 6 | 1 | 8 | 6 | 5 | 3 | 2 | 1 | 1 | X | 0 | Operand B | 1659157 / $R_F$ | 3.25 1582 |
| 1558 Step 1510 | 33 | 50 | 50 | 43 | 11 | 11 | 25 | 20 | 8 | 17 | 17 | 1 | 4 | 2 | 3 | 4 | 2 | 1 | X | 0 | Intermediate product | 6829068642 959 | 1583 |
| 1559 Steps 1520, 1522, 1525 | 0 | 0 | 0 | 0 | 0 | 0 | 34 | 1 | 15 | 20 | 3 | 12 | 2 | 9 | 1 | 4 | 2 | 1 | X | 0 | Mixed Radix Equiv. (MRN) | 6829068642 959 | 1584 |
| 1561 Step 1530 | 0 | 0 | 0 | 0 | 0 | 0 | 34 | 1 | 15 | 20 | 3 | - | - | - | - | - | - | - | X | 0 | Truncated MRN | 133376953 | 1586 |
| 1562 Step 1530 | 19 | 1 | 18 | 1 | 40 | 6 | 10 | 19 | 7 | 15 | 3 | 10 | 5 | 7 | 2 | 3 | 1 | 1 | X | 0 | Truncated MRN to RNS | 133376953 / $R_F$ | 1587 |
| 1564 Steps 1532, 1533 | 20 | 2 | 19 | 2 | 41 | 7 | 11 | 20 | 8 | 16 | 4 | 11 | 6 | 8 | 3 | 4 | 2 | 0 | X | 0 | Round up (add one) | 133376954 / $R_F$ | 366929 > (510510 / 2) 1588 |
| 1566 Step 1540b | 20 | 2 | 19 | 2 | 41 | 7 | 11 | 20 | 8 | 16 | 4 | 11 | 6 | 8 | 3 | 4 | 2 | 0 | 0 | 1 | Set Sign Flags | 133376954 / $R_F$ | +26.2031 1589 |

Digit Modulus

Figure 15

| | Associated Modulus | Power Term | Decimal Value | Associated Digit |
|---|---|---|---|---|
| 1704 → | $M_0 = 2$ | $w_0$ = N/A | N/A | $d_0$ |
| 1705 → | $M_1 = 3$ | $w_1$ = N/A | N/A | $d_1$ |
| 1706 → | $M_2 = 5$ | $w_2$ = N/A | N/A | $d_2$ |
| 1707 → | $M_3 = 7$ | $w_3$ = N/A | N/A | $d_3$ |
| 1708 → | $M_4 = 11$ | $w_4$ = N/A | N/A | $d_4$ |
| 1709 → | $M_5 = 13$ | $w_5$ = N/A | N/A | $d_5$ |
| 1710 → | $M_6 = 17$ | $w_6$ = N/A | N/A | $d_6$ |
| 1711 → | $M_7 = 19$ | $w_7 = 1$ | 1 | $d_7$ |
| 1712 → | $M_8 = 23$ | $w_8 = 19$ | 19 | $d_8$ |
| 1713 → | $M_9 = 29$ | $w_9 = 19*23$ | 437 | $d_9$ |
| 1714 → | $M_{10} = 31$ | $w_{10} = 19*23*29$ | 12673 | $d_{10}$ |
| 1715 → | $M_{11} = 37$ | $w_{11} = 19*23*29*31$ | 392863 | $d_{11}$ |
| 1716 → | $M_{12} = 41$ | $w_{12} = 19*23*29*31*37$ | 14535931 | $d_{12}$ |
| 1717 → | $M_{13} = 43$ | $w_{13} = 19*23*29*31*37*41$ | 595973171 | $d_{13}$ |
| 1718 → | $M_{14} = 47$ | $w_{14} = 19*23*29*31*37*41*43$ | 25626846353 | $d_{14}$ |
| 1719 → | $M_{15} = 53$ | $w_{15} = 19*23*29*31*37*41*43*47$ | 1204461778591 | $d_{15}$ |
| 1720 → | $M_{16} = 59$ | $w_{16} = 19*23*29*31*37*41*43*47*53$ | 63836474265323 | $d_{16}$ |
| 1721 → | $M_{17} = 61$ | $w_{17} = 19*23*29*31*37*41*43*47*53*59$ | 3766351981654057 | $d_{17}$ |

| Figure 16 Control Step | Fractional range digits | | | | | | | Integer digits range | | | | | | | | | Extended digits | | | | | | | Remainder value | Compare result | Rounding constant |
|---|---|---|---|---|---|---|---|---|---|---|---|---|---|---|---|---|---|---|---|---|---|---|---|---|---|---|
| | 2 | 3 | 5 | 7 | 11 | 13 | 17 | 19 | 23 | 29 | 31 | 37 | 41 | 43 | 47 | 53 | 59 | 61 | | | | | | $d_{[j]}$ | | $c_{[j]}$ |
| | $M_0$ | $M_1$ | $M_2$ | $M_3$ | $M_4$ | $M_5$ | $M_6$ | $M_7$ | $M_8$ | $M_9$ | $M_{10}$ | $M_{11}$ | $M_{12}$ | $M_{13}$ | $M_{14}$ | $M_{15}$ | $M_{16}$ | $M_{17}$ | | | | | | | | |
| Step 1601, 1602 | 1 | 2 | 4 | 3 | 2 | 4 | 1 | 17 | 17 | 8 | 20 | 25 | 11 | 11 | 43 | 50 | 50 | 33 | | | |
| Steps 1603-1606, 1609-1612 | * | 2 | 4 | 1 | 6 | 8 | 0 | 8 | 8 | 18 | 25 | 12 | 5 | 5 | 21 | 51 | 54 | 16 | 1 | = | 1 |
| Steps 1603-1606, 1609-1612 | * | * | 4 | 2 | 5 | 2 | 5 | 2 | 2 | 15 | 18 | 28 | 1 | 1 | 22 | 34 | 37 | 25 | 2 | = | 1 |
| Steps 1603-1606, 1609-1612 | * | * | * | 1 | 9 | 10 | 7 | 11 | 18 | 8 | 9 | 27 | 24 | 8 | 13 | 6 | 42 | 53 | 4 | > | 2 |
| Steps 1603-1606, 1609-1612 | * | * | * | * | 9 | 5 | 13 | 15 | 9 | 1 | 10 | 9 | 15 | 1 | 42 | 31 | 48 | 51 | 1 | > | 3 |
| Steps 1603-1606, 1609-1612 | * | * | * | * | * | 2 | 5 | 4 | 0 | 23 | 17 | 0 | 8 | 11 | 3 | 2 | 25 | 26 | 9 | < | 5 |
| Steps 1603-1606, 1609-1612 | * | * | * | * | * | * | 12 | 6 | 14 | 15 | 25 | 34 | 32 | 4 | 29 | 0 | 29 | 30 | 2 | > | 6 |
| Steps 1603-1606, 1609-1612 | * | * | * | * | * | * | * | 3 | 15 | 7 | 19 | 10 | 6 | 40 | 1 | 18 | 1 | 19 | 12 | < | 8 |
| Steps 1603-1606 | * | * | * | * | * | * | * | * | 20 | 17 | 9 | 14 | 39 | 11 | 37 | 51 | 3 | 49 |
| Step 1607 | 1 | 1 | 1 | 3 | 3 | 3 | 3 | 3 | 3 | 3 | 3 | 3 | 3 | 3 | 3 | 3 | 3 | 3 |
| Step 1607 | 1 | 0 | 3 | 3 | 3 | 3 | 3 | 3 | 3 | 3 | 3 | 3 | 3 | 3 | 3 | 3 | 3 | 3 |
| Step 1608 | 1 | 0 | 3 | 3 | 3 | 3 | 3 | 3 | 3 | 3 | 3 | 3 | 3 | 3 | 3 | 3 | 3 | 3 |

\* = Digit marked as skipped

Control Step Result:
- $d_7 = 3$
- $W_7 = 1$
- $W_7 * d_7 = 3$
- Acc = 3 + 0

| | Associated Modulus | Power Term | | Decimal Value | Associated Digit |
|---|---|---|---|---|---|
| 2305 → | $M_0 = 2$ | $w_0 =$ | 1 | 1 | $d_0$ |
| 2306 → | $M_1 = 3$ | $w_1 =$ | 2 | 2 | $d_1$ |
| 2307 → | $M_2 = 5$ | $w_2 =$ | 2*3 | 6 | $d_2$ |
| 2308 → | $M_3 = 7$ | $w_3 =$ | 2*3*5 | 30 | $d_3$ |
| 2309 → | $M_4 = 11$ | $w_4 =$ | 2*3*5*7 | 210 | $d_4$ |
| 2310 → | $M_5 = 13$ | $w_5 =$ | 2*3*5*7*11 | 2310 | $d_5$ |
| 2311 → | $M_6 = 17$ | $w_6 =$ | 2*3*5*7*11*13 | 30030 | $d_6$ |
| 2312 → | $M_7 = 19$ | $w_7 =$ | 1 | 1 | $d_7$ |
| 2313 → | $M_8 = 23$ | $w_8 =$ | 19 | 19 | $d_8$ |
| 2314 → | $M_9 = 29$ | $w_9 =$ | 19*23 | 437 | $d_9$ |
| 2315 → | $M_{10} = 31$ | $w_{10} =$ | 19*23*29 | 12673 | $d_{10}$ |
| 2316 → | $M_{11} = 37$ | $w_{11} =$ | 19*23*29*31 | 392863 | $d_{11}$ |
| 2317 → | $M_{12} = 41$ | $w_{12} =$ | 19*23*29*31*37 | 14535931 | $d_{12}$ |
| 2318 → | $M_{13} = 43$ | $w_{13} =$ | 19*23*29*31*37*41 | 595973171 | $d_{13}$ |
| 2319 → | $M_{14} = 47$ | $w_{14} =$ | 19*23*29*31*37*41*43 | 25626846353 | $d_{14}$ |
| 2320 → | $M_{15} = 53$ | $w_{15} =$ | 19*23*29*31*37*41*43*47 | 1204461778591 | $d_{15}$ |
| 2321 → | $M_{16} = 59$ | $w_{16} =$ | 19*23*29*31*37*41*43*47*53 | 63836474265323 | $d_{16}$ |
| 2322 → | $M_{17} = 61$ | $w_{17} =$ | 19*23*29*31*37*41*43*47*53*59 | 3766351981654057 | $d_{17}$ |

Figure 23

| | 2400 "Fractional" Digit Modulus | | | | | | 2401 "Whole" Digit Modulus | | | | | | 2402 "Extended" Digit Modulus | | | | | | | 2403 Value Term | 2404 Figure Reference | 2405 Machine Value | 2406 Equivalent Value |
|---|---|---|---|---|---|---|---|---|---|---|---|---|---|---|---|---|---|---|---|---|---|---|
| | 2 | 3 | 5 | 7 | 11 | 13 | 17 | 19 | 23 | 29 | 31 | 37 | 41 | 43 | 47 | 53 | 59 | 61 | | | | |
| | $M_0$ | $M_1$ | $M_2$ | $M_3$ | $M_4$ | $M_5$ | $M_6$ | $M_7$ | $M_8$ | $M_9$ | $M_{10}$ | $M_{11}$ | $M_{12}$ | $M_{13}$ | $M_{14}$ | $M_{15}$ | $M_{16}$ | $M_{17}$ | | | | |
| 2407 → | 1 | 2 | 2 | 1 | 7 | 5 | 15 | 17 | 22 | 17 | 24 | 33 | 38 | 27 | 9 | 7 | 29 | 12 | Operand A | 2102 | 4115967 / $R_F$ | 8.0625 |
| 2408 → | 1 | 1 | 2 | 3 | 5 | 6 | 8 | 1 | 6 | 9 | 6 | 3 | 10 | 2 | 10 | 45 | 18 | 18 | Operand B | 2104 | 1659167 / $R_F$ | 3.25 |
| 2409 → | 1 | 2 | 2 | 1 | 7 | 5 | 15 | 6 | 6 | 7 | 8 | 13 | 9 | 1 | 41 | 1 | 47 | 4 | Fraction part of A | 2025 of 2110 | 31997 / $R_F$ | 0.0625 |
| 2410 → | 0 | 2 | 3 | 1 | 8 | 8 | 8 | 8 | 8 | 8 | 8 | 8 | 8 | 8 | 8 | 8 | 8 | 8 | Whole part of A | 2030 of 2110 | 8 | 8 |
| 2411 → | 1 | 1 | 2 | 3 | 5 | 6 | 8 | 4 | 0 | 27 | 0 | 14 | 35 | 3 | 22 | 3 | 10 | 15 | Fraction part of B | 2025 of 2120 | 127627 / $R_F$ | 0.24999 |
| 2412 → | 1 | 0 | 3 | 3 | 3 | 3 | 3 | 3 | 3 | 3 | 3 | 3 | 3 | 3 | 3 | 3 | 3 | 3 | Whole part of B | 2030 of 2120 | 3 | 3 |
| 2413 → | 1 | 2 | 4 | 3 | 2 | 4 | 1 | - | - | - | - | - | - | - | - | - | - | - | Partial Fraction multiply | 2205 | | |
| 2414 → | 1 | 2 | 4 | 3 | 2 | 4 | 1 | 1 | 10 | 21 | 13 | 0 | 20 | 10 | 0 | 10 | 8 | 14 | Partial Fraction multiply ext. | 2225 | 366929 | |
| 2415 → | 0 | 0 | 4 | 3 | 2 | 4 | 1 | 5 | 0 | 15 | 0 | 34 | 28 | 3 | 9 | 3 | 57 | 60 | Full Fraction multiply | 2235 | 40721946889 | |
| 2416 → | 0 | 0 | 0 | 0 | 0 | 0 | 0 | 4 | 13 | 23 | 18 | 34 | 8 | 36 | 9 | 46 | 49 | 46 | Full Fraction multiply – partial multiply extended | 2240 | 40718277765 | |
| 2417 → | 0 | 0 | 0 | 0 | 0 | 0 | * | 18 | 2 | 23 | 2 | 21 | 19 | 14 | 43 | 14 | 42 | 1 | Fractional range $R_F$ | 2152 | 510510 | |
| 2418 → | * | * | * | * | * | * | * | 18 | 12 | 24 | 16 | 30 | 13 | 40 | 35 | 19 | 52 | 1 | Fractional range inverse ($R_F^{-1}$) | 2245 | | |
| 2419 → | * | * | * | * | * | * | * | 15 | 18 | 1 | 9 | 21 | 22 | 21 | 33 | 26 | 11 | 46 | ($R_F^{-1}$ * (full fraction product – ext partial fraction product)) | 2250 | | |
| 2420 → | 0 | 2 | 1 | 3 | 1 | 7 | 3 | 15 | 18 | 1 | 9 | 21 | 22 | 21 | 33 | 26 | 11 | 46 | Fully extended fractional term | 2230, 2132 | 7976 / $R_F$ | 0.0156 |
| 2421 → | 1 | 0 | 1 | 3 | 10 | 2 | 11 | 18 | 18 | 21 | 24 | 2 | 27 | 3 | 29 | 3 | 23 | 12 | Fraction * integer term 1 | 2140 | 95721 / $R_F$ | 0.1875 |
| 2422 → | 0 | 2 | 1 | 3 | 7 | 9 | 13 | 13 | 0 | 13 | 0 | 1 | 34 | 24 | 35 | 24 | 21 | 59 | Fraction * integer term 2 | 2142 | 1021010 / $R_F$ | 1.9999 |
| 2423 → | 0 | 0 | 0 | 0 | 0 | 0 | 0 | 14 | 2 | 1 | 17 | 23 | 5 | 35 | 45 | 18 | 5 | 24 | Scaled whole product term | 2154 | 12252240 / $R_F$ | 24.0 |
| 2424 → | 1 | 1 | 3 | 2 | 7 | 5 | 10 | 3 | 15 | 7 | 19 | 10 | 6 | 40 | 1 | 18 | 1 | 19 | Final summation | 2160 | 13376953 / $R_F$ | 26.2031 |

Figure 24

SYSTEM AND METHOD FOR IMPROVED FRACTIONAL BINARY TO FRACTIONAL RESIDUE CONVERTER AND MULTIPLER

1. CROSS-REFERENCE TO RELATED APPLICATION

This application claims priority to U.S. Provisional Patent Application No. 61/919,730, filed, Dec. 21, 2013, and is a continuation-in-part of U.S. patent application Ser. No. 13/475,979, filed May 19, 2012.

BACKGROUND OF THE INVENTION

2. Field of the Invention

The invention relates to general purpose arithmetic logic units (ALUs), and in particular to an ALU utilizing a residue number system in performing arithmetic operations.

3. Related Art

The binary number system is the most widely used number system for implementing digital logic, arithmetic logic units (ALU) and central processing units (CPU). Binary based computers can be used to solve and process mathematical problems, where such calculations are performed in the binary number system. Moreover, an enhanced binary arithmetic unit, called a floating point unit, enhances the binary computers ability to solve mathematical problems of interest, and has become the standard for most arithmetic processing in science and industry.

However, certain problems exist which are not easily processed using binary computers and floating point units. One such class of problems involves manipulating and processing very large numbers. One example is plotting the Mandelbrot fractal at very high magnification. In order to plot the Mandelbrot fractal at high magnifications, a very long data word is required. Ideally, the Mandelbrot fractal plotting problem necessitates a computer with an extendable word size.

The main issue is that any real computer must be finite in size, and consequently the computer word size must be fixed at some limit. However, closer analysis reveals other contributing problems. One such problem is the propagation of i carryî bits during certain operations, such as addition and multiplication. Carry propagation often limits the speed at which an ALU can operate, since the wider the data word, the greater the path for which carry bits are propagated. Computer engineers have helped to reduce the effect of carry by developing carry look-ahead circuitry, thereby minimizing, but not eliminating, the effects of carry.

However, even the solution of implementing look-ahead carry circuits introduces its own limitations. One limitation is that look-ahead carry circuits are generally dedicated to the ALU for which they are embedded, and are generally optimized for a given data width. This works fine as long as the CPU word size is adequate for the problems of interest. However, once a problem is presented which requires a larger data width, the CPU is no longer capable of using its native data and instruction formats for direct processing of the larger data width.

In this case, computer software is often used to perform calculations on larger data widths by breaking up the data into smaller data widths. The smaller data widths are then processed by the CPUis native instruction set. In the prior art, software libraries have been written specifically for this purpose. Such libraries are often referred to as arbitrary precisioni math libraries. Specific examples include the arbitrary precision library from the GNU organization, and the high precision arithmetic library by Ivano Primi.

However, software approaches to processing very large data widths have significant performance problems, especially as the processed data width increases. The problem is that software processing techniques tend to treat the smaller data widths as digits, and digit by digit processing leads to a polynomial increase in execution time as the number of digits increases. In one example, an arbitrary precision software routine may take four times as much time to execute when the data width is doubled. When using arbitrary precision software solutions, the amount of processing time often becomes impractical.

One possible solution is to build a computer which is not based on binary arithmetic, and which does not require carry propagation logic. One candidate number system is the residue number system (RNS). Residue number addition, subtraction and multiplication do not require carry, and therefore do not require carry logic. Therefore, it is possible that RNS addition, subtraction and multiplication be very fast, despite the word size of the ALU. These facts have provided some interest for RNS based digital systems in the prior art; unfortunately, prior art RNS based systems are only partially realized, and have failed to match the general applicability of binary based systems in essentially every instance. This fact is evident from the lack of practical RNS based systems in the current state of the art.

The reasons for the failure of RNS based systems to displace binary systems are many. Fundamental logic operations, such as comparison and sign extension, are more complex in RNS systems than traditional binary systems, and require more logic circuitry and execution time. For many experts, it is often assumed the difficulty of RNS comparison, RNS to binary conversion, and RNS sign and digit extension make RNS based processors and ALUs impractical for general purpose processing.

In addition to the problems noted above, the lack of a practical RNS integer divide further restricts the applicability of RNS based systems of the prior art. Also, the lack of general purpose fractional number processing has (severely) restricted the usefulness of RNS based digital systems of the prior art. In summary, prior art RNS systems cannot process numbers in a general purpose manner, and this has relegated such systems to little more than research subjects.

From the discussion that follows, it will become apparent that the present invention addresses the deficiencies associated with the prior art while providing numerous additional advantages and benefits not contemplated or possible with prior art constructions.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

FIG. 5 is a waveform timing diagram of an example demonstration of a fractional binary to fractional residue converter.

FIG. 15 is an example fractional residue multiplication computation illustrating intermediate residue values and states.

FIG. 17 is a table pictorial illustrating the organization of a power term source.

FIG. 18 is an example fractional residue multiplication computation illustrating intermediate residue values and states.

FIG. 23 is a table pictorial illustrating the organization of a power term source.

FIG. 24 is an example fractional residue multiplication computation illustrating intermediate residue values and states.

SUMMARY OF THE INVENTION

Figure 1:
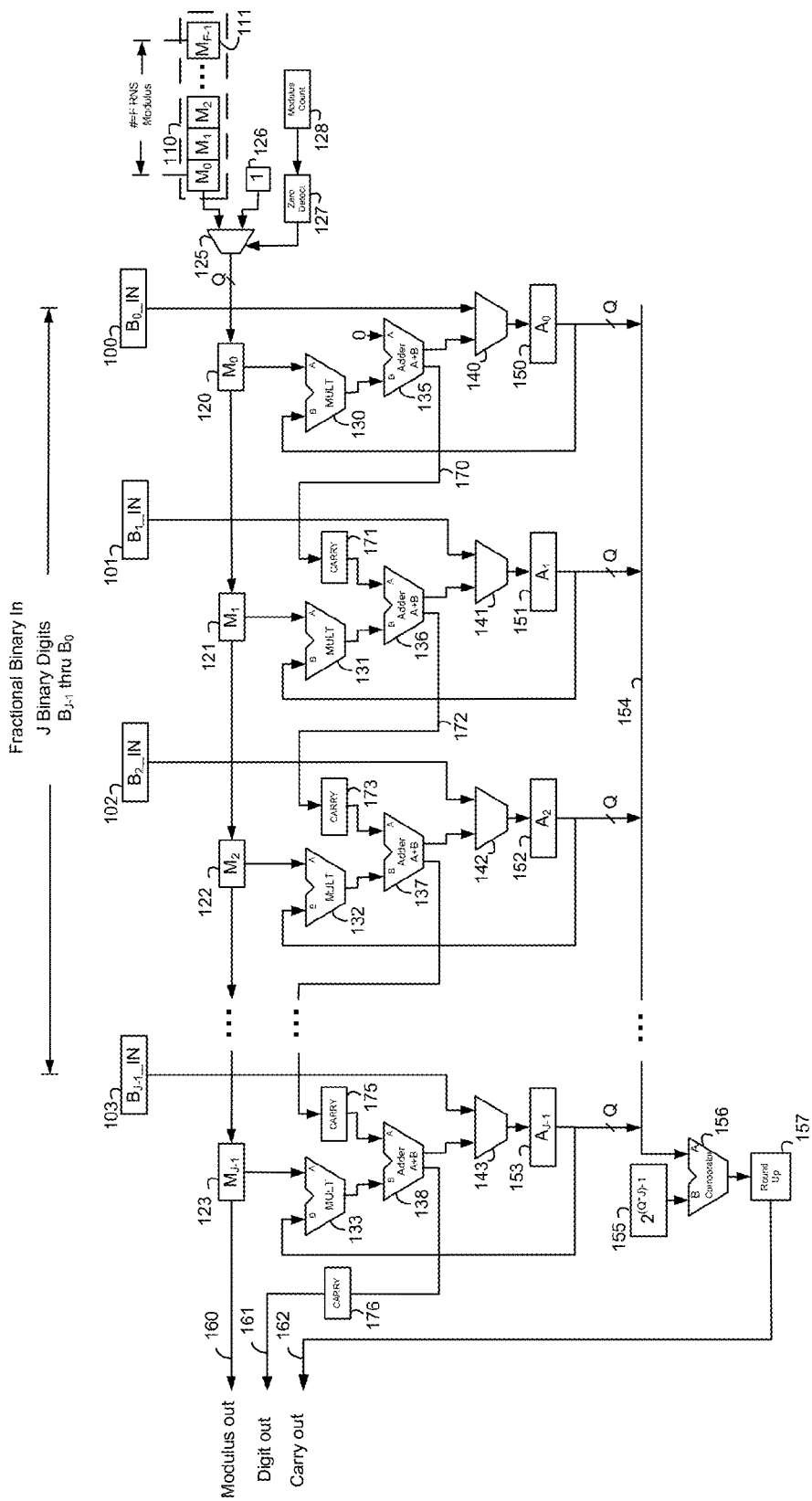
FIG. 1 is a block diagram illustrating the first stage of a two stage apparatus for fractional binary to fractional residue conversion.

Various converter and multiplier apparatus and methods utilizing residue numbers are disclosed herein. For instance, in one exemplary embodiment, a residue number normalization unit may comprise a plurality of digit processing units that perform one or more modular arithmetic operations on one or more operands to generate an output within a predefined modulus value, a common data bus that transmits data to and from each of the plurality of digit processing units, and a digit power multiplier that receives a mixed radix digit and an associated digit power value, and transmit a resulting weighted digit power product. The multiplier is coupled to the digit power accumulator, and the modular arithmetic operations do not result in a carry value.

The residue number normalization unit also includes a digit power accumulator coupled to a result selector that receives and accumulate weighted digit power products, and a controller that transmits one or more commands to instruct one or more of the plurality of digit processing units to: convert one or more residue numbers having at least a fractional representation to a plurality of digits in mixed radix format; receive one or more mixed radix digits, each digit associated with a mixed radix power, and multiplying the digit value by the associated mixed radix power, thereby forming a weighted digit power product; and sum a selected portion of the plurality of weighted digit power products The result selector, responsive to one or more controller commands, transmits a result from among one or more candidate normalization values.

In another exemplary embodiment, a residue converter configured to convert a fractional binary value to a fractional residue value is provided, with such residue converter comprising an input register that receives a plurality of binary input digits, the plurality of binary input digits configured as a parallel binary input receiving a binary fractional value, a modulus shift register that stores a plurality of modulus values and to output each of the plurality of modulus values in sequence, and a first plurality of digit processing units that performs one or more arithmetic operations on a plurality of binary input digits and on a sequence of modulus values, and to generate a plurality of digit values and modulus values.

Each digit processing unit comprises a modulus operand register that receives a modulus value from a prior processing stage, and configured to send a modulus value to a succeeding processing stage, an additive operand register that receives a digit value from a prior processing stage, a digit accumulator that stores a binary digit value, a multiplier that multiplies the contents of said digit accumulator with the contents of said modulus operand register generating an accumulator modulus product, and an adder that adds said accumulator modulus product with the contents of said additive operand register, and configured to send a least significant portion of the adder result to said digit accumulator, and a most significant portion of the result to a successive processing stage.

A second plurality of digit processing units that receive digit values and modulus values from said first plurality of digit processing units, and to perform one or more modular arithmetic operations on a plurality of residue digits, each digit processing unit are also included. Each of the second plurality of digit processing units comprise a residue digit register that stores a residue digit, a modular multiplier that receives a modulus value from an input modulus bus and a value from said residue digit register, and is sends a residue product result, and a modular adder that receives said residue product result, and configured to receive a digit value from an input digit value bus. After a plurality of processing cycles, a fractional residue number equivalent to a binary fractional input is stored in the plurality of said residue digit registers;

It is noted that at least one said prior processing stage is said modulus shift register, and at least one said digit processing unit configured to send a digit value and a digit weight to a second plurality of digit processing units. Also, the first plurality of digit processing units process numbers in binary format while the second plurality of digit processing units process digits in residue number format.

Various methods are disclosed herein as well. For example, a method for multiplying a first fractional residue operand to a second fractional residue operand is provided, with such method comprising separating a first fractional residue operand into a first fractional only portion and a first whole integer only portion, separating a second fractional residue operand into a second fractional only portion and a second whole integer only portion; multiplying the first fractional only portion with the second fractional only portion forming an intermediate fractional only product term, multiplying the first fractional only portion with the second whole integer only portion to form a first intermediate fraction and whole product term, and multiplying the second fractional only portion with the first whole integer only portion to form a second intermediate fraction and whole product term.

The method also includes multiplying the first whole integer only portion with the second whole integer only portion forming a whole integer only product, scaling the whole integer only product by a fractional range value forming a scaled whole integer only product, truncating a first fractional only portion forming a truncated first fractional only portion, truncating a second fractional only portion forming a truncated second fractional only portion, multiplying the truncated first fractional only portion with the truncated second fractional only portion forming a truncated partial product, subtracting the truncated partial product from aforementioned intermediate fractional only product term forming an intermediate fractional product term evenly divisible by a fractional range, and multiplying the intermediate fractional product term that is evenly divisible by a fractional range with a multiplicative inverse of a fractional range forming a recovered fractional only portion. A final result is generated by summing a recovered fractional only portion, a first intermediate fraction and whole product term, a second intermediate fraction and whole product term, and a scaled whole integer only product.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

DETAILED DESCRIPTION

1. Improved Fractional Binary to Fractional Residue Converter Apparatus

Figure 2:
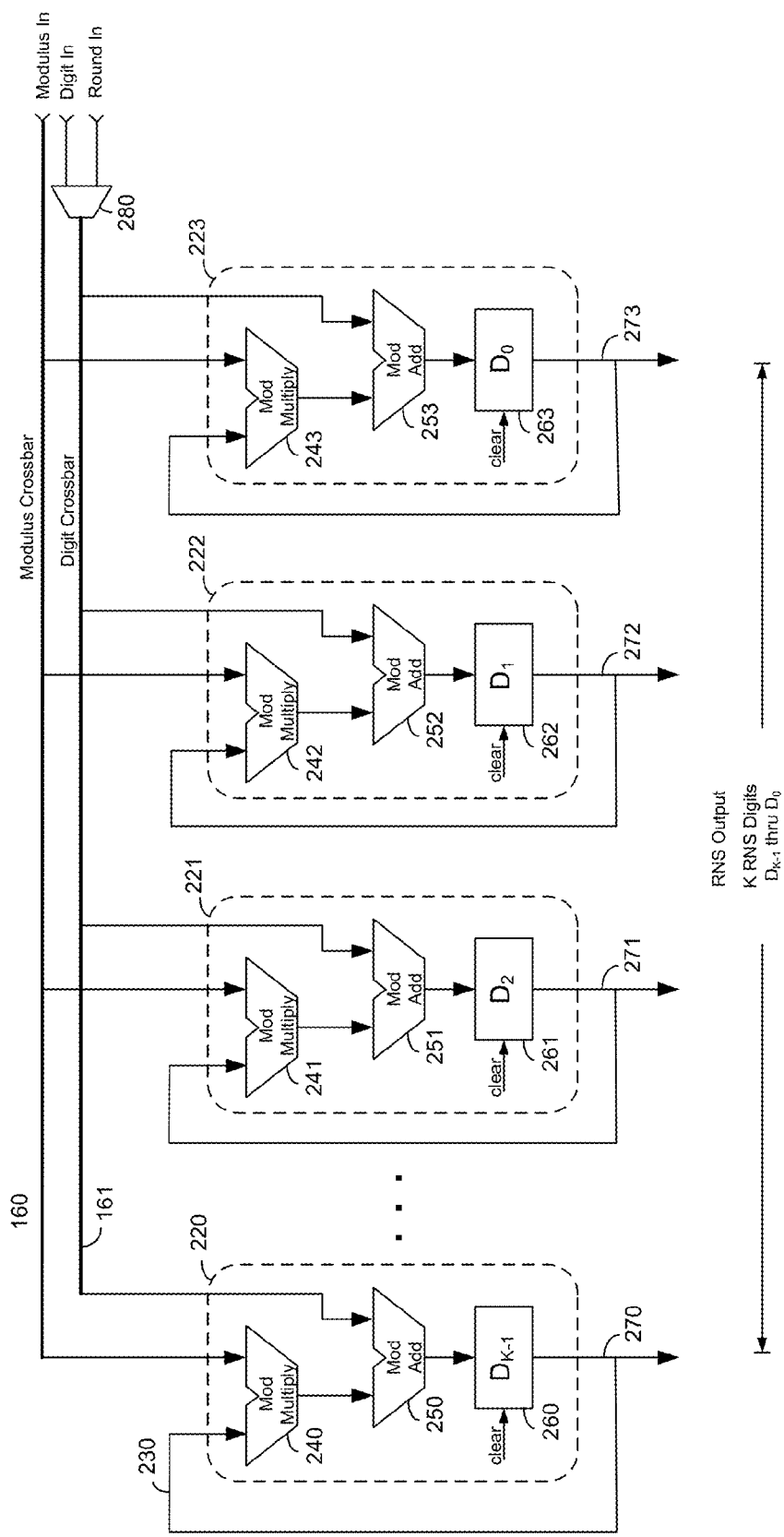
FIG. 2 is a block diagram illustrating the second stage of a two stage apparatus for fractional binary to fractional residue conversion.

In order to take advantage of high speed operation of the RNS ALU, high speed conversion of integer and fractional data, from binary to residue format, is required. FIG. 1 and FIG. 2 disclose a streamlined version of the conversion apparatus described in U.S. Patent Publication No. 2013/0311532, which is incorporated herein by reference. The streamlined apparatus requires less clock cycles for the conversion process, therefore, it is generally faster.

FIG. 1 and FIG. 2 illustrate a J+K digit converter apparatus of the present invention by means of example. FIG. 1 discloses a first plurality of J binary digit stages, and FIG. 2 discloses a second plurality of K number of RNS digit stages. The converter is an enhanced version of the forward fractional converter of U.S. patent application Ser. No. 13/475,979.

The apparatus accepts a fractional only binary value into the B_IN port shown at top of FIG. 1. The B_IN port accepts binary data using a series of binary digit latches, $B_0$ IN 100 through $B_{J-1}$ IN 103. The digit latches may have the same maximum bit width Q as the residue digits of FIG. 2 in one embodiment. These latches are for input holding only, and may be replaced by a bus in some embodiments.

In the first clock cycle, the binary value ($B_0$) through ($B_{J-1}$) input at B_IN is latched into conversion data registers $A_0$ 150 through $A_{J-1}$ 153. Also, modulus registers $M_0$ 120 through $M_3$ 123 are initialized with the value of one using hardware not shown for sake of clarity. This initialization ensures the values of digit registers $A_0$ through $A_{J-1}$ are not destroyed, but are preserved in the next following clock cycle.

As taught in U.S. patent Publication No. 2013/0311532, a plurality of modulus values is associated to an RNS fractional range. As shown in FIG. 1 and by means of example, F number of modulus values are associated with the fractional range, such as modulus $M_{F-1}$ 111. All F number of modulus values are stored, or pre-stored, into a memory or shift register, shown by modulus shift register 110. Upon each clock of the conversion, the modulus values stored in modulus shift register 110 are sequentially shifted into modulus data register $M_0$, where $M_0$ feeds $M_1$, and so on and so forth through $M_{J-1}$ as shown. At each clock cycle, each modulus value serves as an operand to a specific digit multiplier of a digit processing block, such as multiplier 130 thru 133, thereby multiplying the current state of the digit $A_0$ 150 thru $A_{J-1}$ 153 by a different modulus value.

During each clock cycle, a carry value may be generated by each digit multiplier, illustrated by data path 170 for example. In one preferred embodiment, the carry value data width equals the data width of the binary input digit, so designated as Q in FIG. 1. Each carry value propagates towards the left and is latched by the next digit processing unit in FIG. 1. In FIG. 1, the high order bits of the last digit multiplier, shown by example as multiplier 133, is output by digit output bus 161 to the second plurality of RNS digit processing stages as shown in FIG. 2. Likewise, the modulus value shifted into the last modulus register stage 123 is output by bus 160 to the second plurality of RNS digit processing stages of the converter shown in FIG. 2.

During operation, at some number of clock cycles, modulus values stored in modulus shift register 110 begin appearing at modulus output bus 160; likewise, carry values begin appearing at digit out bus 161. In FIG. 2, a second plurality of digits stages is shown by means of example. The modulus out bus 160 of FIG. 1 connects and drives modulus crossbar 160 of FIG. 2. Likewise, the digit output bus 161 of FIG. 1 connects to and drives digit crossbar bus 161 of FIG. 2.

In FIG. 2, at each clock cycle, residue digit processing units 220, 221, 222, 223 multiply, in a modular fashion, the value of the modulus output value 160 by the current value of digit registers 260, 261, 262, 263 respectively. Each multiplier result is summed, in a modular fashion, to the value on the digit out bus 161 and stored back into the digit register 260, 261, 262, 263 respectively. The adders 250, 251, 252, 253 and multipliers 240, 241, 242, 243 perform modular arithmetic, and support a multiply, add and accumulate operation for a specific and unique pair-wise prime digit modulus respectively. In one preferred embodiment, digit function blocks, such as digit function blocks 220, 221, 222, 223, act in unison and perform a similar operation, but with a different modulus value. When the last modulus and carry value exit the apparatus of FIG. 1 via modulus out data path 160 and digit out data path 161, they are processed by the plurality of RNS digit function blocks of FIG. 2, and the final result is stored in digit accumulator registers 260, 261, 262, 263. A final converted result, in residue fractional format, may be transferred out of the converter using digit buses 270, 271, 272, 273.

The residue multiply and add operation performs the same arithmetic calculations as the later stages of the fractional converter of FIG. 20D of U.S. patent application Ser. No. 13/475,979. In that disclosure and referring to FIG. 20D, the high order (leftmost) digit function blocks are replaced by a series of residue stages as shown in the present disclosure of FIG. 2. It is noted the first stages of both converters remain much the same. According to the new enhancements, once stage 1 conversion has completed processing, the second stage as shown in FIG. 2 will typically terminate one or two clocks later. On completion, the second plurality if RNS digit processing units contains the scaled fractional value in residue format. This is in contrast to the invention of FIG. 20D of U.S. patent application Ser. No. 13/475,979 where the second plurality of digit processing units is in binary format, and therefore requires additional clock cycles to further complete conversion into a residue fractional format.

FIG. 1 also discloses apparatus for detecting a round-up of the converted result. Rounding is an important feature, and is typically a mandatory feature in order to provide a converted result with the most accuracy. In FIG. 1, after the basic conversion described above is complete, the values of binary register digits $A_0$ 150 through $A_{J-1}$ 153 are valid. The value contained in the binary registers is a remainder of the conversion, and may be compared with a round-up threshold value 155 using comparator 156. In one embodiment, if the value equals or exceeds the threshold, the converted value contained in registers $D_0$ 273 thru $D_{K-1}$ is rounded up by incrementing the converted value by one unit. For example, if rounding is performed, each digit register 260, 261, 262, 263 of FIG. 2 is incremented by one in a modular fashion. In some embodiments, only the most significant binary bit of the most significant binary digit, i.e., A3 153, is used to determine if a round-up is required. If a round-up is required, such indication may be transmitted by carry out bus 162 to a controller, not shown, responsible for performing the increment operation. It should be clear to those skilled in the art of digital design that alternate types of rounding and/or alternate threshold values may be used.

When considering the conversion of a fractional binary value which contains both a fractional part and a whole (integer) part, the integer part may be separated from its fractional part before conversion begins in one embodiment. This is beneficial, since fractional conversion differs from integer conversion, and performing both conversion processes in separate and in parallel saves time. In one embodiment of the present invention, integer and fractional conversion are performed in parallel. After conversion, the integer and fractional values are added together when in residue format. Conversion of integer and fractional values in parallel generally improves throughput of real-world conversions. This teaching is disclosed in U.S. Patent Publication No. 2013/0311532 and is not dealt with in any more detail herein.

Figure 3:
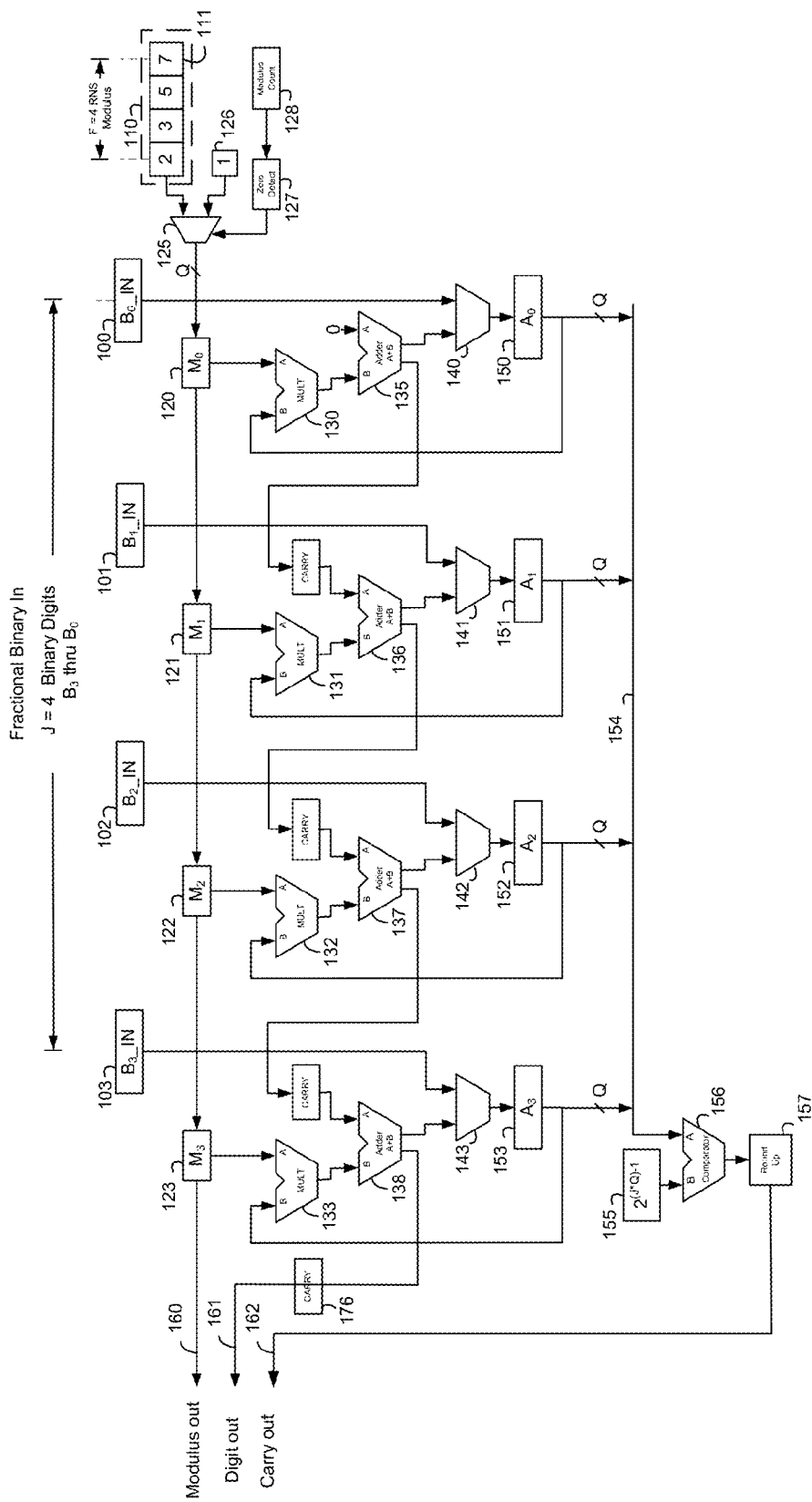
FIG. 3 is a block diagram illustrating the first state of a two stage apparatus for example demonstration of a fractional binary to fractional residue converter.
Figure 4:
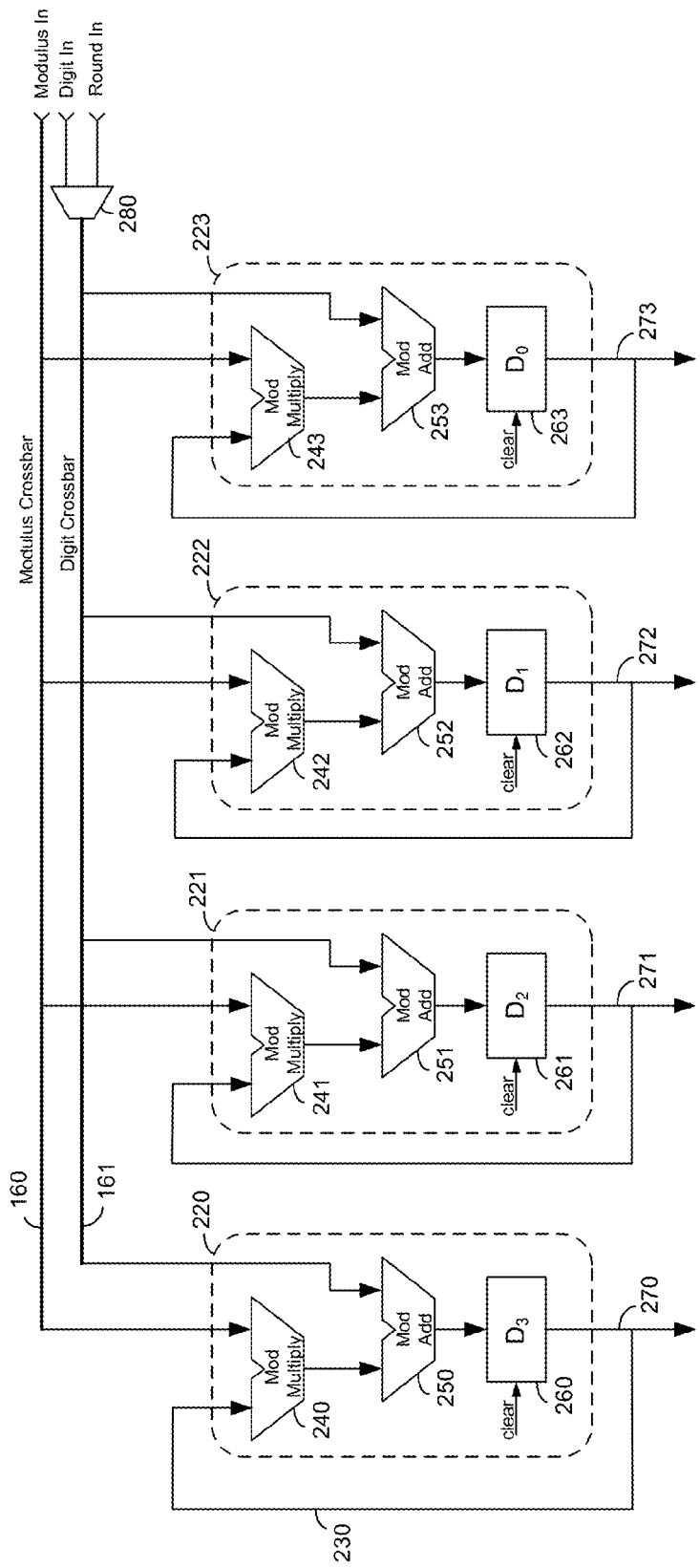
FIG. 4 is a block diagram illustrating the second state of a two stage apparatus for example demonstration of a fractional binary to fractional residue converter.

In FIG. 3, FIG. 4, and FIG. 5, an example fractional conversion is illustrated to clarify the apparatus of FIG. 1 and FIG. 2. In this example, FIG. 3 is derived from FIG. 1 and shows four distinct binary digit processing stages or units, and FIG. 4 is derived from FIG. 2 and shows four distinct RNS digit processing stages or units. Reference designators from FIG. 1 and FIG. 2 have been preserved in FIG. 3 and FIG. 4 for clarity. In addition, a timing diagram illustrating the various data flows of the example conversion apparatus of FIG. 3 and FIG. 4 is disclosed in FIG. 5. At the bottom of FIG. 5, the reader will note the actual numerical values used in the conversion apparatus example. These example values coincide with the example values provided in U.S. Patent Publication No. 2013/0311532 for clarity of disclosure and comparison of the methods.

It should be noted that in any specific embodiment of the present invention, the number of digit processing stages of the first plurality of binary digit processing units need not equal the number of digit processing stages of the second plurality of RNS digit processing units. Moreover, the number of associated fractional modulus contained in modulus shift register 110 of FIG. 1 need not match either the number of binary digit processing units or the number of RNS digit processing units. However, in the following example disclosure, all of these numbers equal four by means of example only.

In the waveform diagram of FIG. 5, the flow of data is illustrated through the apparatus of FIG. 3. When viewing the waveform diagram, each major storage register is denoted under the first column, i.e., the column labeled "register". For example, the modulus registers $M_0$ 120 thru $M_3$ 123 are listed as the first four registers in the waveform diagram of FIG. 5 in the rows 511, 512, 513, 514. Also shown in the waveform diagram of FIG. 5 is ten columns denoting each clock cycle of the conversion process, labeled cycle 0 thru cycle 8. When considering a particular storage element, the value stored in that element may change in each successive cycle. Therefore, traversing the waveform diagram from left to right indicates the register values for each storage element on a cycle by cycle basis.

When viewing the contents of a plurality of registers at any given instant, for example, digit registers $A_0$ 150 thru $A_3$ 153 of FIG. 3, one may inspect the values in one column of the waveform diagram of row 515, 517, 519, 521 respectively. For example, at cycle 0, the register values contained in $A_0$, $A_1$, $A_2$ and $A_3$ are all seen to be hex digit value five (0x5) in FIG. 5. This corresponds to the loading of the fractional binary value 0x5555 at the start of conversion per the example values provided. Moreover, the modulus registers $M_0$, $M_1$, $M_2$ and $M_3$ are seen to be initialized to the value of one at cycle 0 which corresponds to the initialization of all modulus registers with the value of one prior to conversion processing.

In FIG. 5, in row 515, and moving to the cycle 1 column, the result of the first clock of the conversion process is shown, which illustrates that digit register $A_0$ has transitioned from the hex value of 0x5 to the hex value 0xA. Also shown in the clock 1 column, rows 517, 519, 521 show the digit registers $A_1$, $A_2$ and $A_3$ remain unchanged. In addition to the transitions of modulus registers and digit registers, rows 516, 518, 520 illustrate the storage or transmission of carry values from previous digit processing stages of FIG. 3 for each clock cycle. In particular, the value output by digit out bus 161 of FIG. 3 is generated from the last carry output labeled "Digit out" of FIG. 5, row 521, which is connected to the digit crossbar 161 of FIG. 4. Likewise, the value of modulus register $M_3$ 123 of FIG. 3 is shown in FIG. 5, row 514, and this value therefore drives the Modulus out bus 160, which is connected to the Modulus crossbar 160 of FIG. 4.

Also shown in FIG. 5, rows 522, 523, 524, 525 are the states of the four RNS digit registers $D_0$, $D_1$, $D_2$ and $D_3$ respectively. The RNS registers are initialized to zero as shown in the cycle 0 column of the waveform diagram of FIG. 5. At clock cycle 4, the digit out bus 161 will output a value of zero, and the modulus out bus 160 will output the value of two. Therefore, in the next clock cycle, all four RNS digit processing units of FIG. 4 will process the two values on each of the crossbar buses. Because all RNS digit registers are zero, the multiplication result will be zero in each digit processing unit, and the following addition of zero will result in each RNS digit register receiving the value of zero. This result is shown in the next cycle, the cycle 5 column of FIG. 5, rows 522, 523, 524, 525.

During cycle 5 of the waveform diagram, the next digit out bus value will be one and the next modulus out bus value will be three. Therefore, in the next cycle, cycle 6, each RNS digit register will multiply its zero value by three (3), and add a value of one. This results in a value of one stored in each RNS digit processing unit $D_0$ thru $D_3$ of FIG. 4. In cycle 6, the digit out bus will receive the value of four, and the modulus out bus will receive the value of five (5). Therefore in cycle 7 column, the value of one stored in each RNS digit processing unit will be multiplied by five and this result will be added to four and stored back into each RNS digit register $D_0$ thru $D_3$. Taken together, the RNS value contained in registers $D_0$ thru $D_3$ is the value nine (9) which is represented by the RNS value (1,0,4,2) using the example modulus of (2,3,5,7), since each RNS digit processing unit is modulo its pair-wise prime modulus.

In cycle 7, the next digit out bus value is shown to be six (6), and the next modulus out bus value is shown to be seven (7). Again, multiplying nine by seven results in a value of 63, and adding the value of 6 results in an RNS register value of 69. This result is shown in cycle 8 of FIG. 5 and is represented as the RNS value (1,0,4,6) shown enclosed in the dotted ellipse 500. In cycle 8, the modulus register value is one, and therefore, the conversion process is over with the exception of a possible round-up correction.

In cycle 8, the remainder value of the conversion is contained in binary digit registers $A_0$ thru $A_3$, and this value is 0×FFBA. Since this value is greater than half the range of a normalized unit, i.e. 0×8000, then the final RNS value stored in registers $D_0$ thru $D_3$ is incremented by one using a modulo add. The modulo increment may be performed by sending a value of one to the Modulus crossbar (which it is be default), and by sending the TRUE output of the comparator 157 of FIG. 3, interpreted as the value one, to the digit crossbar via selector unit 280 of FIG. 4. In other words, selector 280 of FIG. 4 is enabled such that it selects the output of comparator 156 of FIG. 3, and gates a value of one to the digit crossbar if the comparator output indicates a round up should be performed. If so, the RNS value contained in digit registers $D_0$ thru $D_3$ is incremented. This is shown in cycle 9 as the RNS value (0,1,0,0) and this value is shown enclosed in the dotted lines 510 of FIG. 5.

As shown in the example values section of FIG. 5, the resulting RNS fractional value is exactly the fractional value of one third, since $^{7}\!/_{21}$ is exactly interpreted as the correctly converted value of the approximated one third value represented in a binary fractional format ($^{0\times5555}\!/_{0\times10000}$). This ends the example section of the improved converter of the present invention.

2. Fractional RNS Multiplier Apparatus

There is a need for faster fractional residue multipliers. As disclosed in U.S. Patent Publication No. 2013/0311532, several embodiments for fractional RNS multipliers was disclosed. In one embodiment, the fractional multiplier provided for a single clock per RNS digit plus some additional clocks to convert the mixed radix intermediate result back to residue format for continued processing.

In this application, several new methods and apparatus providing fractional value RNS multiplication are disclosed. Specifically, a new method and apparatus is provided which is built upon the apparatus disclosed in U.S. Patent Publication No. 2013/0311532 but further reduces, or eliminates, the clocks required for final conversion of mixed radix back to residue format. This reduces the total number of steps or clocks, and provides for faster operation. Second, a still faster method and apparatus for fractional RNS multiplication is provided that further reduces the required clocks or steps by performing steps in parallel. This second method provides a tradeoff by requiring increased hardware in return of reduced processing latency. Reduced processing latency is required in many applications, in which the result of the multiplication is needed immediately for further processing.

Both new methods and associated apparatus increase the speed at which a single fractional multiplication can be performed in residue format. Both methods therefore reduce the latency of a single multiplication in residue format. We will introduce the first improved method next.

In U.S. Patent Publication No. 2013/0311532, FIGS. 15A, 15B and 15C provide flowcharts for several novel RNS fractional value multipliers. In that application, a suitable fractional RNS format is devised, and several unique apparatus are disclosed which perform a multiply of two fractional RNS values. In FIG. 15C of that application, an advanced multiplier is disclosed which performs multiplication of signed fractional values. Likewise, the present invention discloses a method which performs the operations disclosed in the flowchart 15C, but in a more efficient manner in terms of clock cycles. With respect to the new methods disclosed herein, and referring to FIG. 15C of U.S. Patent Publication No. 2013/0311532, the steps of conversion of mixed radix back to residue format 1530a and 1530b is performed in parallel with the process of converting the original product from residue to mixed radix 1525a and 1525b.

This is possible, since each mixed radix digit represents a weighted value. The value represented by each mixed radix digit may be converted to a residue value. One may therefore convert each mixed radix digit to a residue value, and add this value to a residue summation of all other converted digits. The final residue summation will be the truncated mixed radix value in residue format, provided the mixed radix digits associated with the fractional digits are discarded, i.e., not added to the residue summation. Therefore, using a new and unique apparatus of the present invention, during the conversion cycle of a mixed radix digit, its value may be converted and summed in residue format in the same or next clock cycle.

The unique new RNS fractional multiplier of the present invention can process the operation in P clocks for a P digit fractional format. This P digit format includes all extended digits required to contain the extended, or non-normalized, fractional value.

Figure 6A:
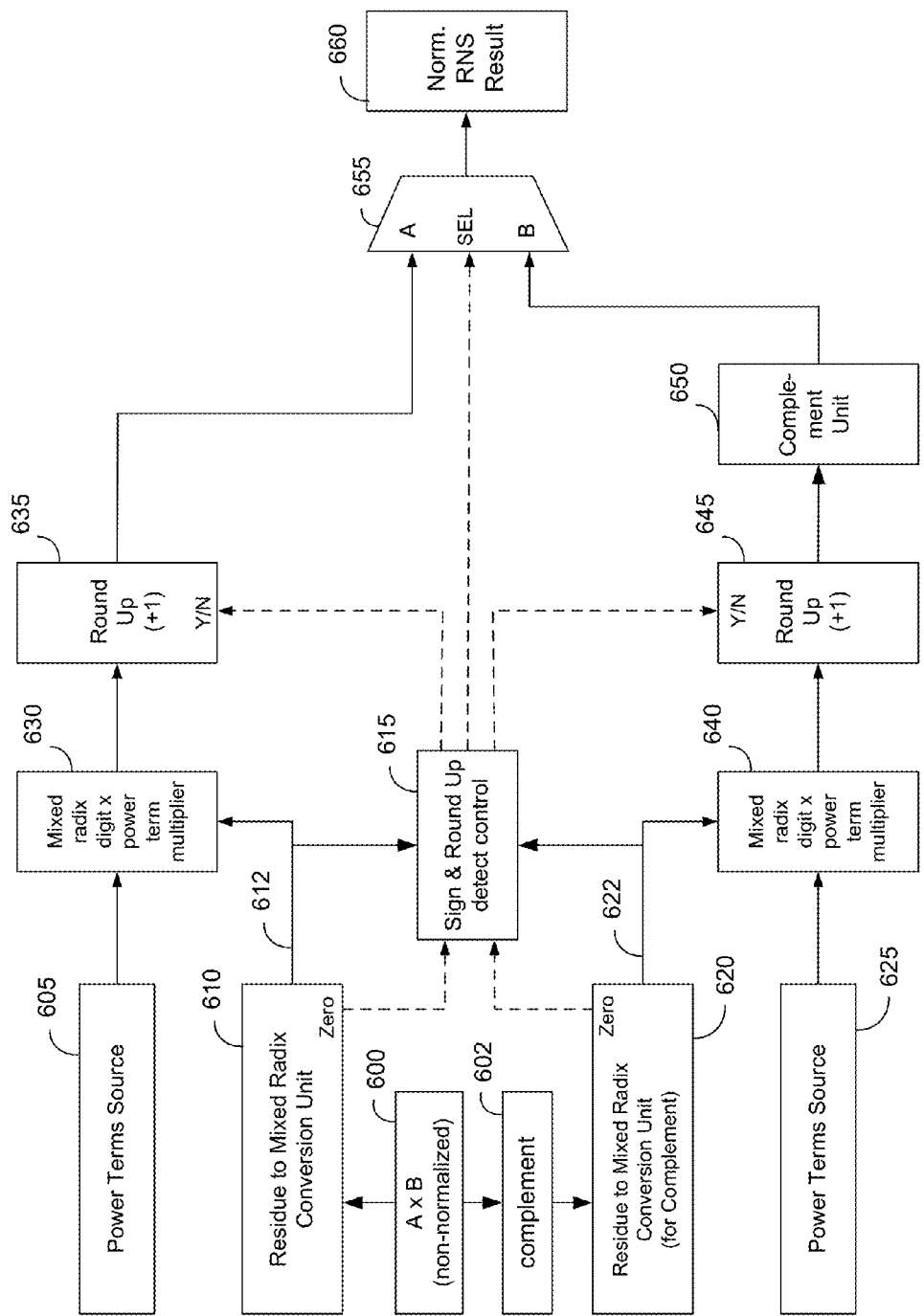
FIG. 6A is a block diagram illustrating a fast residue multiply and normalization apparatus for use as a fractional residue multiplier apparatus.

One unique and preferred embodiment for a scalar residue multiplier is shown in FIG. 6A. It is noted that a scalar multiplier is specifically not a pipelined multiplier unit. A fully pipelined variation of the new multiplier is also a claimed invention, but its design details are not disclosed in this application; however, such a variation should be evident to those skilled in the art of digital design. The new RNS multiplication starts with a non-normalized product, denoted as block 600 in FIG. 6A. This is similar to FIG. 15c of U.S. Patent Publication No. 2013/0311532, whereas the multiplication starts with an RNS integer multiply of two fractional value operands (i.e., treating both fractional value operands as integers and multiplying both operands using an RNS integer multiply). The resulting product is loaded into register 600, in RNS format, upon start of the fractional multiply. In this disclosure, such a product value is commonly called an intermediate product (IP), and may also be referred to or described as a non-normalized product. Additionally, other non-normalized intermediate products, such as a fractional product sum, may be a suitable starting value at register 600.

Valid sign flags or sign extended operands are not needed for either or both operands at start; instead, the new multiplier will produce a result that is signed and flagged as sign valid. In other words, the new multiplier produces a fully sign extended, normalized result regardless of whether the operands themselves have been sign extended. This is accomplished using two values computed in parallel, i.e., the original intermediate product value and the complement of the original intermediate product value. This complement operation is performed on the non-normalized product 600 by complement unit 602. The complement is therefore loaded for processing into the residue to mixed radix converter 620. The original (non-normalized) value 600 is loaded directly into its own residue to mixed radix converter 610.

One may view the residue multiplier of FIG. 6A as computing two answers. Of the two possible results, the result having the smallest magnitude is always the correctly processed value. If the smallest result is derived from the complemented intermediate product 602, the final result is known to be negative, and therefore the correctly processed result must be complemented again as a final step using complement unit 650.

The residue to mixed radix conversion was described in detail in U.S. Patent Publication No. 2013/0311532, to which novel advancements to its digit unit design are disclosed herein. In particular, the present disclosure highlights a solution for digit ALU logic which does not require excessively large look up tables (LUT). In this embodiment, LUT size does not dramatically increase as digit width is increased. A residue to mixed radix converter which may utilize the described residue digit processing units will follow next, however, it should be clear that many other solutions to digit logic exist including LUT based solutions. These other solutions do not minimize the novel method of the fractional multipliers of the new inventions described herein.

A. Residue Digit Logic Enhancements

To better explain the residue based fractional multipliers of the present invention, we will first review the required residue digit logic, otherwise known herein as the residue digit processing unit. Residue digit logic is the logic used to employ the basic modulo digit operations required within a residue ALU, such as the residue ALU disclosed in U.S. Patent Publication No. 2013/0311532. The residue digit logic apparatus and their associated operations are also used in the design of residue ALU sub-units, such as multipliers, adders, and converters.

In a residue ALU, most digit operations are modular arithmetic. In at least one embodiment, each digit has its own modulus p pre-assigned. When adding two arbitrary numbers, digits of the same modulus are added and a MOD function modulo p is applied to the result. (The mod function is commonly denoted as % in C programming language.) If only legal values of a residue digit are added between two arbitrary values, then a basic î single rangeî residue digit adder will suffice. In this context, a legal digit value includes zero and any positive value up to, but not including, the pre-assigned modulus p. The single range modulo adder is composed of a conventional binary adder, a comparator and a subtract unit to implement the modular add function. This type of circuit is conventional to those skilled in the art, and is shown in FIG. 7.

Figure 7:
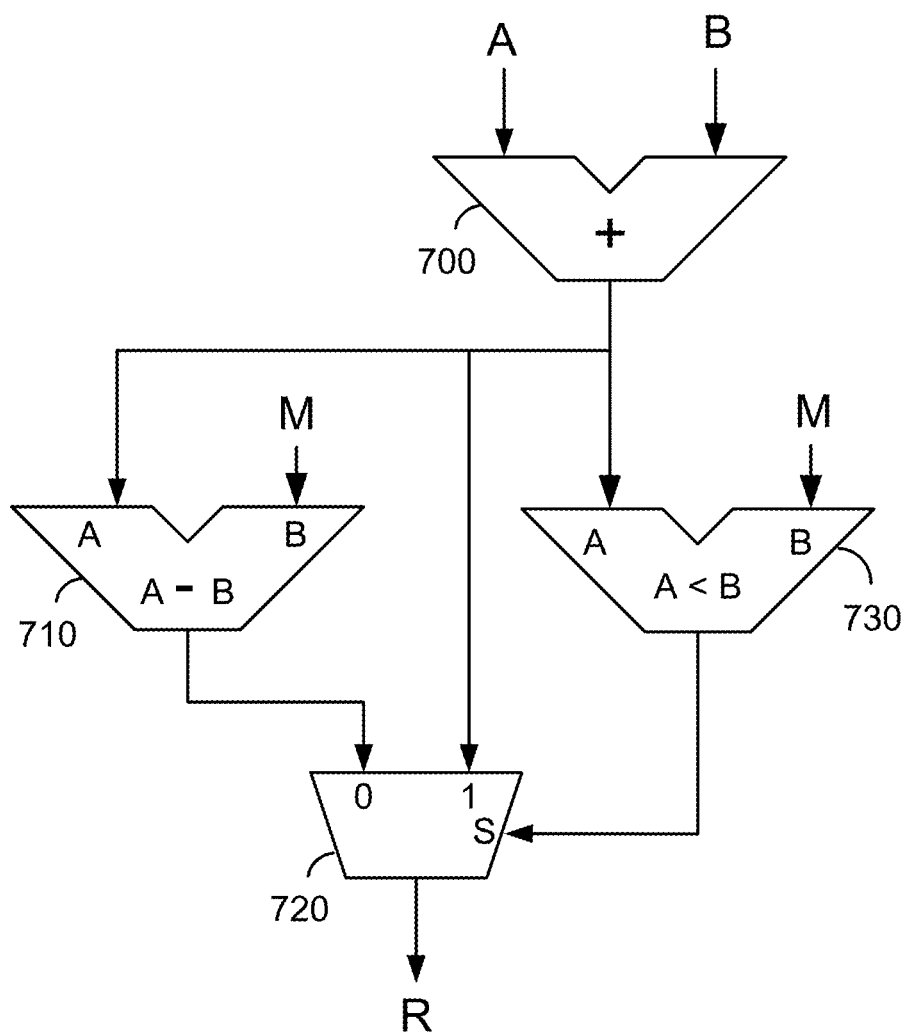
FIG. 7 is a block diagram illustrating a modular arithmetic addition processing unit.

In FIG. 7, residue digit values, A and B, are summed using a binary add unit 700. The result of the binary add is then transferred to one input of a binary subtract unit 710, and also the result is transferred to one input of a binary comparator 730. The circuit is so configured that if the result of binary addition 700 is less than the digit modulus p, the modulus p designated as M in FIG. 7, the result is sent directly as a result through bus selector 720 since the output of comparator 730 is TRUE, or 1. If the output of comparator 730 is FALSE, or 0, then the result of the add unit 700 is greater than or equal to the modulus M, so the bus selector selects the output of the subtract unit 710, which decreases the binary sum by the amount of the modulus M. The correct modular sum result appears on output R of bus selector 720 in either case. The digit function is general, since it may take on any value of modulus, M=p.

Figure 8:
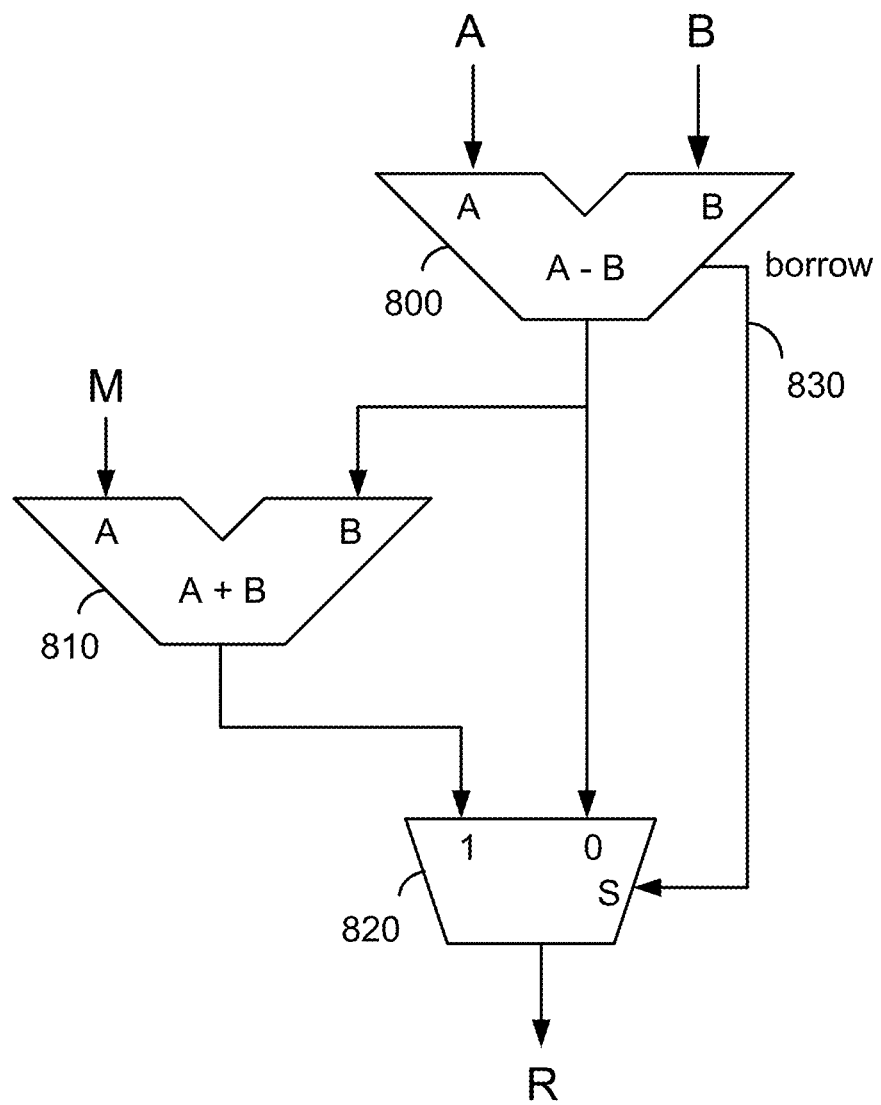
FIG. 8 is a block diagram illustrating a modular arithmetic subtract processing unit.

The operation of single range modulo subtract unit is very similar to that of modulo addition, and is also conventionally known to those skilled in the art. In the most basic case, simplification results from the fact that a single range subtraction is bounded to less than twice the digit range. In this case, a single subtract unit, a single add unit and a single comparator can be used. In FIG. 8, a novel yet minor improvement uses borrow signal 830 from a binary subtract unit 800 to replace the comparator of FIG. 7. If the result of the subtract unit 800 is positive, borrow signal 830 is false, and bus selector 820 passes the subtract unit 800 result directly to result R. Otherwise, if the borrow signal is asserted, the binary subtract unit 800 result is negative, and so the value of the modulus M is summed to the result using add unit 810. Bus selector 820 passes the output of add unit 810 since the borrow signal 830 is true. Again, in either case, the correct modular digit subtract result appears as a result.

Figure 9:
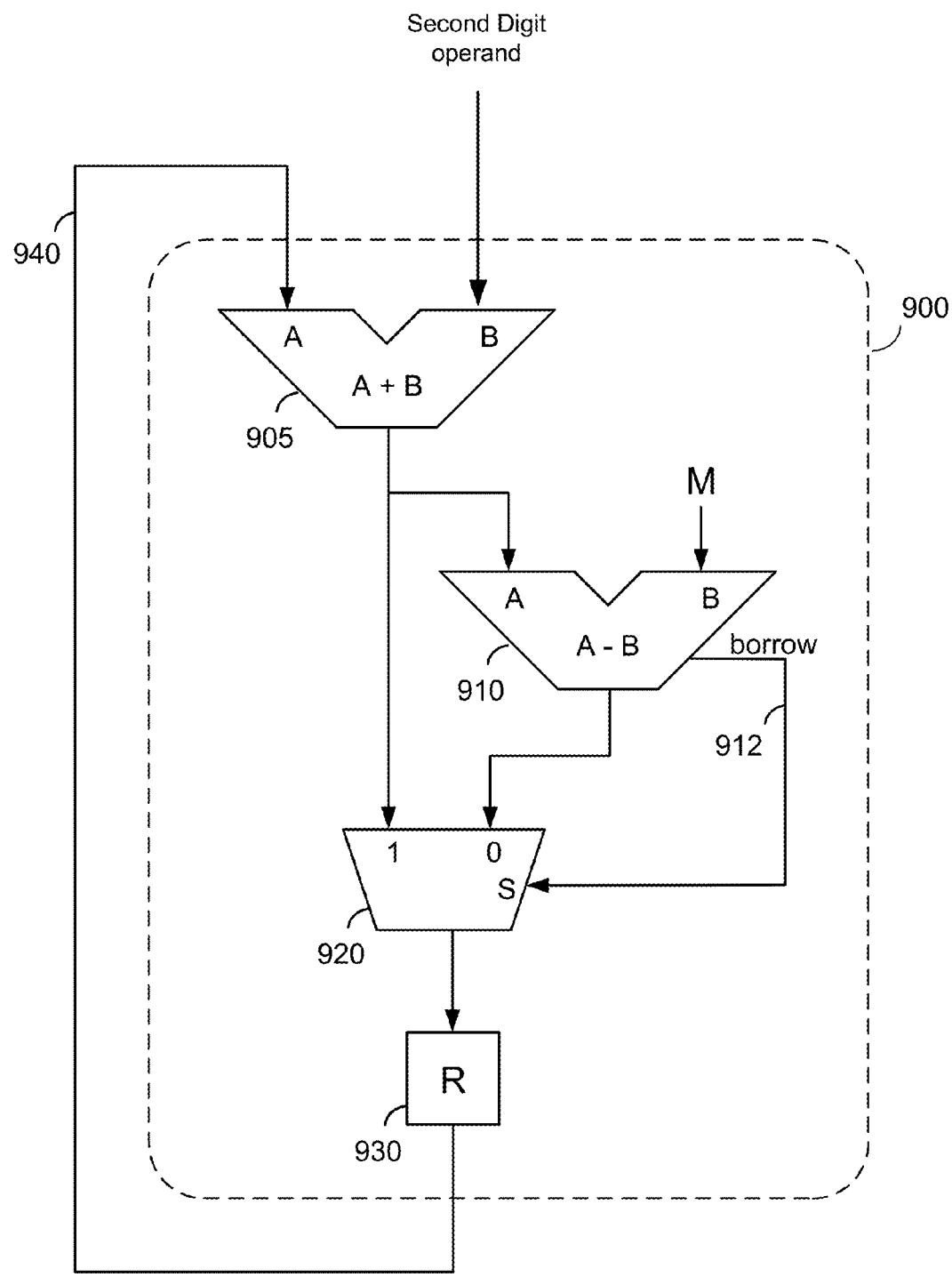
FIG. 9 is a block diagram illustrating a modular arithmetic add and accumulate unit.

The same logic reduction used to implement the modular digit subtract unit of FIG. 8 can be adapted to a single range modulo digit add unit of FIG. 7 by introducing a borrow signal that steers the correct value to the output. This is shown in FIG. 9 where a single range modular digit add unit 900 is depicted. In particular, the modular digit add unit 900 of FIG. 9 also supports a registered result 930 whose output 940 is fed back to one of the operand inputs of the modular add unit 900. This modification to the modular add unit 900 is termed a modular digit add and accumulate unit.

Figure 10:
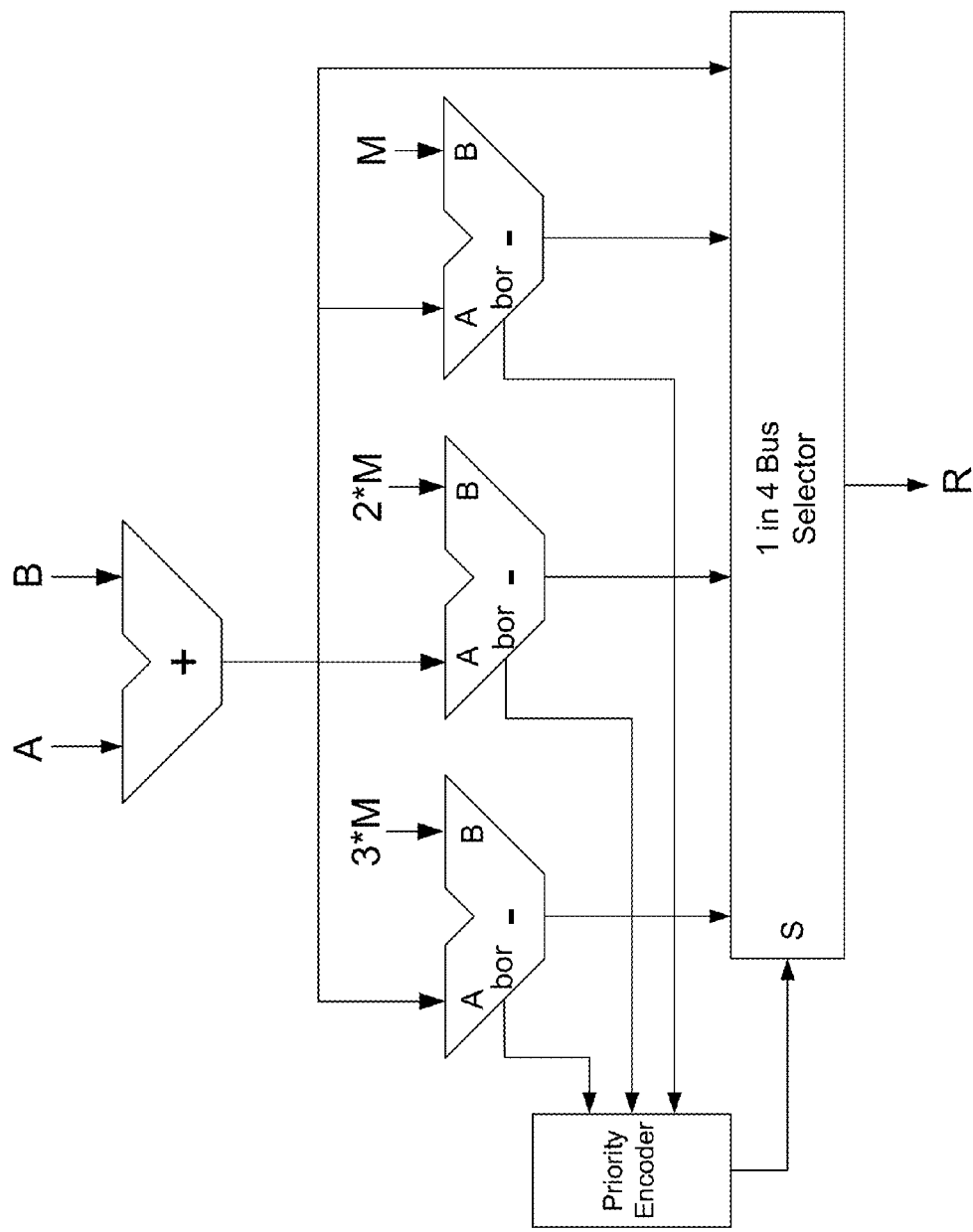
FIG. 10 is a block diagram illustrating a modular arithmetic add unit with extended digit range.

Residue digit functions such as add and subtract are more complex if the range of the digit operands exceed the legal digit range. This can occur if the digit processing unit must accept an operand from another digit modulus, for example. In this case, the relative value of digit modulus with respect to each other is an important design parameter for the residue ALU. For example, if no modulus is more than twice as large as any other modulus, then digit subtract circuits may be designed to handle this extended digit range of input operands. On the other hand, if the plurality of modulus p of an ALU varies widely, say by a factor of 4 or 5 times, then more complex circuits are needed. FIG. 10 shows a digit adder circuit which supports a larger range. The operation of the extended range add or subtract unit is not discussed in detail and should be obvious to those skilled in the art.

Residue digit multiplication is another important requirement of the residue ALU. Residue digit multiplication is again modular, and since the product of a normal binary multiplier produces a range far in excess of the modulus M=p, a means for applying a MOD p function (% p) across this range is required. In many cases, a LUT memory is used. If a LUT memory is used in a brute force fashion, very large memories are required if the digit modulus is large, since up to M*M table entries may be needed. Therefore, there is a need to reduce the size of LUT memory for implementing modular digit functions such as digit multiplication.

Figure 11:
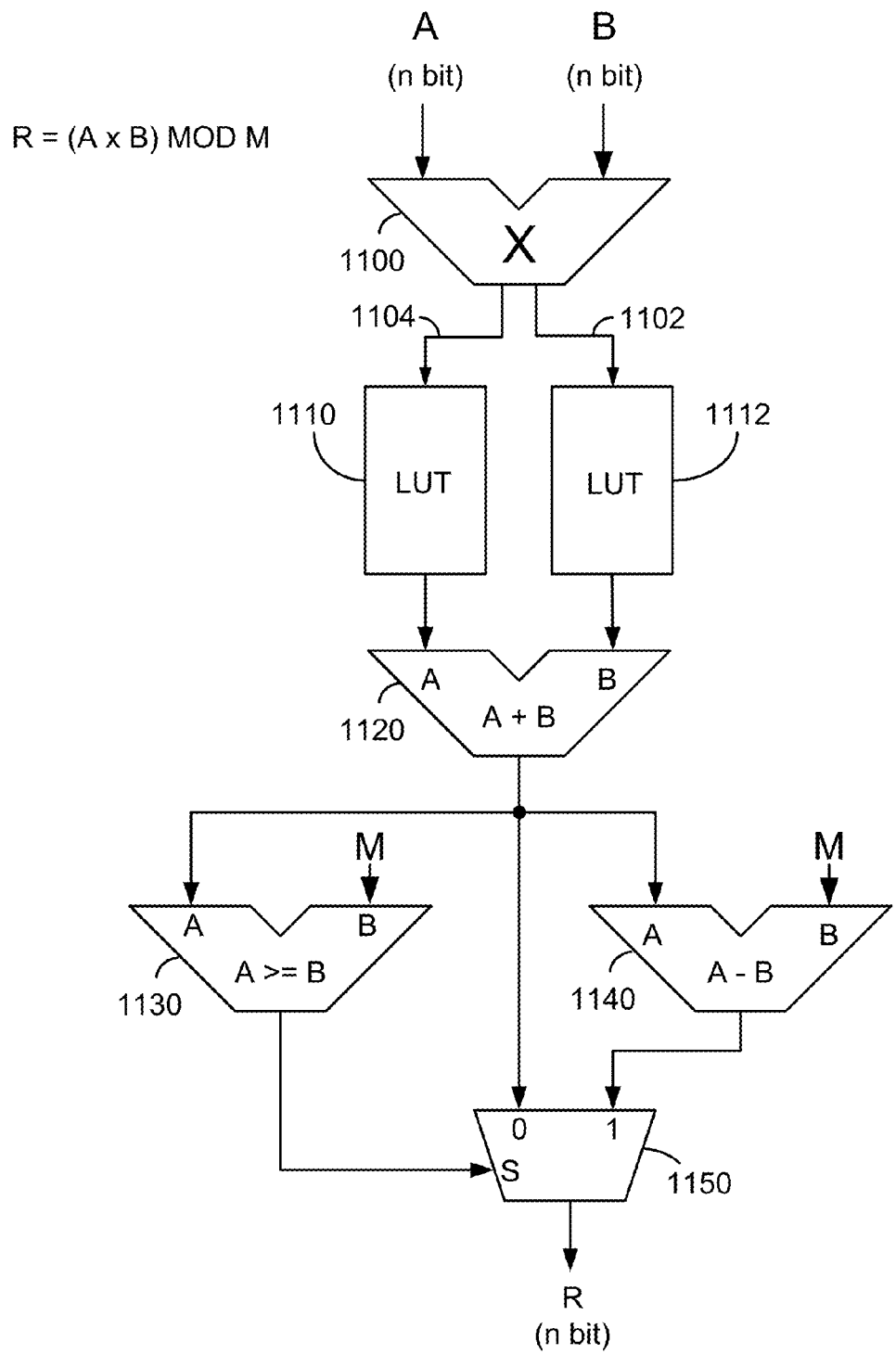
FIG. 11 is a block diagram illustrating a modular arithmetic multiplier unit.

FIG. 11 shows a novel implementation of a residue digit multiplier which significantly reduces the amount of LUT memory needed. The multiplier unit uses a conventional binary multiplier 1100 to multiply two n-bit operands A and B. The n-bit operand width should be wide enough to accept the range of the modulus values required, which may include digit values from other digit modulus outside the legal range of the digit modulus M=p. The product output of multiplier 1100 is 2*n bits wide. The low order n bits of the product output 1102 are routed to LUT 1112, and the high order n bits of the product result 1104 are routed to LUT 1110.

In the embodiment of FIG. 11, low order LUT 1112 is programmed using the following formula: data[LUT_ADR]=LUT_ADR % M. High order LUT 1110 is programmed using: data[LUT_ADR]=(LUT_ADR*$2^n$) % M.

The effect of the LUT 1112 and LUT 1110 is to provide two unsigned integers whose sum MOD M is the correct modular multiplication result R. Each LUT output is bounded by modulus M, so the sum of each output may not exceed the modulus M by two times; therefore, the basic modular digit adder of FIG. 7 may be used to provide the correct result. Similar to FIG. 7 is the solution in FIG. 11, which shows a binary adder 1120, comparator 1130, subtract unit 1140 and bus selector 1150 configured to provide the modular addition of the results of each LUT 1110 and 1112. The result R appears at the output of bus selector 1150.

Another important modular digit operation is inverse multiplication, also referred to as MODDIV in U.S. Patent Publication No. 2013/0311532. As disclosed in that application, this operation may be implemented in a brute force manner using a LUT memory. However, this application also discloses a unique and novel method for implementing a smaller LUT which encodes a multiplicative inverse of a given modulus $p_0$ with respect to another digit modulus $p_1$. A LUT table therefore includes N–1 number of multiplicative inverses for the given p, which provides a means to process a multiplicative inverse digit operation with respect to any other given digit modulus for an ALU having N distinct pair-wise prime digit modulus. For inverse modular digit multiplication of the present invention, the primary requirement is that for every digit modulus, a multiplicative inverse exists for each of the other supported digit modulus. A digit modulus does not require an inverse for itself, since this digit is undefined after digit division by its own modulus.

Figure 12:
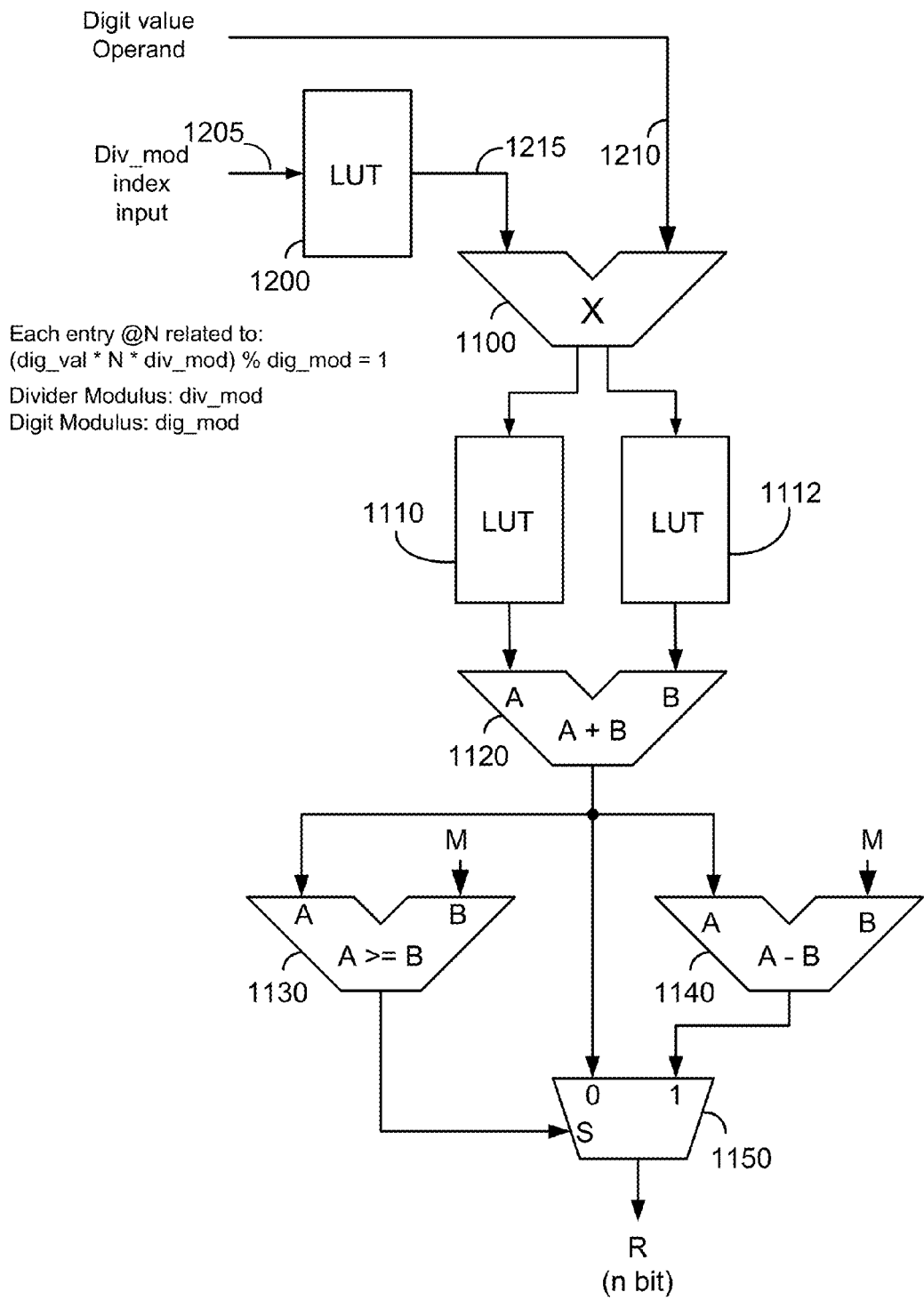
FIG. 12 is a block diagram illustrating a modular arithmetic inverse modulus multiplier unit.

In FIG. 12, the modular digit multiplier of FIG. 11 is shown with the addition of LUT 1200. The LUT 1200 contains the multiplicative inverse of the given digit modulus p with respect each other digit modulus of the ALU or ALU unit. The input 1205 to the look-up table (LUT) 1200 is labeled ì Div_modî, which is an index to the specific multiplicative inverse (of p) associated with, and with respect to, the indexed modulus. The output of LUT 1200, i.e., the multiplicative inverse ofp with respect to the selected modulus, "Div_mod", is then multiplied by a digit value input via bus 1210 using multiplier 1100. The remainder the modular multiply apparatus remains identical to the modular digit multiplier of FIG. 11.

For example, a residue ALU having 32 pair-wise prime digit modulus may support a 32 entry LUT 1200 to store 31 multiplicative inverses, each inverse associated with each of the other 31 modulus. Therefore, inverse modular multiplication can be used for dividing a residue value by any of the ALU digit modulus, by first ensuring the overall residue value is evenly divisible by the selected modulus, then by multiplying each digit of the ALU by its multiplicative inverse of the selected modulus specified by the "Div_mod" index input 1205. In one preferred embodiment, each LUT 1205 for each inverse digit multiplier will be organized such that the Div_mod input 1205 is common to all inverse digit multiplier processing units.

In FIG. 6A, residue to mixed radix conversion unit 610 uses successive digit modulus divide operations to reduce the residue value into a series of mixed radix digits. This conversion process is well known, and is described in Tanaka as well as U.S. Patent Publication No. 2013/0311532. Before dividing a residue value by a particular modulus, the digit value at the particular modulus is subtracted from the entire residue value (the entire residue value is all residue digits interpreted as a single residue value). The subtracted digit is also a mixed radix digit that is output using data path 612 and data path 622 in FIG. 6A. Once a residue value is divided by a modulus value, the particular modulus is defined as skipped, or ignored. (In fact, the specific digit modulus is undefined until a base extension is performed.) In conversion of non-zero residue value to mixed radix, one or more digit modulus divides is performed on the residue value until it is reduced to zero. Before dividing a residue value by a specific digit modulus, the digit at that specific modulus becomes a mixed radix digit. All mixed radix digits generated complete an equivalent mixed radix number. The mixed radix number format is unique to a given sequence of digit modulus divides. Digit divides are performed using a subtract, then a multiply of the residue value by the inverse of the modulus divisor.

Figure 13:
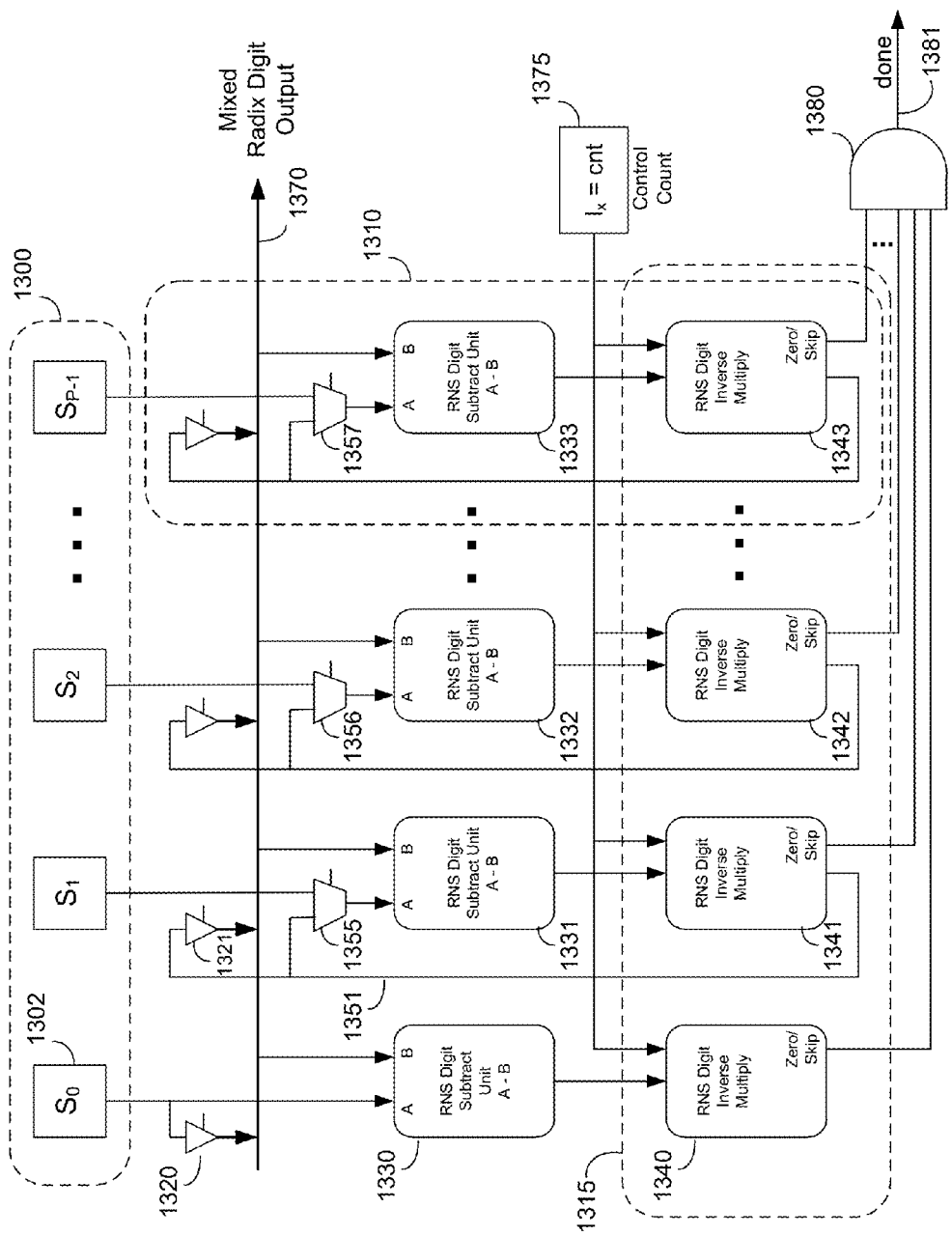
FIG. 13 is a block diagram illustrating a residue to mixed radix converter unit.

The residue to mixed radix conversion units 610, 620 of FIG. 6A may support P number of digits, by means of example and as shown in further detail using FIG. 13. The residue to mixed radix converter apparatus of FIG. 13 is similar to that disclosed in U.S. Patent Publication No. 2013/0311532. Control logic and circuitry is not shown for simplicity. A plurality of residue digit latches 1300 store an initial starting residue value having P number of residue digits. This starting value is loaded into the converter through a plurality of bus selectors, such as bus selectors 1355, 1356 & 1357 as shown in FIG. 13. The bus selectors send the initial residue value through P number of digit subtract units, such as digit subtract unit 1330, 1331, 1332 & 1333. These digit subtract units may have circuitry similar to FIG. 8 in some embodiments, where each subtract unit contains a unique modulus value M. In some embodiments, an initial subtract operation by the value of the first digit processed is performed during the load operation. For example, in the apparatus of FIG. 13, the first digit sends its value onto the digit subtract crossbar 1370 through tri-state buffer 1320 upon loading the initial start value. Each digit subtraction unit therefore applies the same digit value as a subtrahend operand via common crossbar 1070.

The result of subtracting the digit value from the load value is then sent to the inverse multiplier unit for each digit processing unit 1310. The inverse multiplier unit, taken as a whole, is shown as a plurality of digit function blocks, such as function blocks 1340, 1341, 1342, & 1343 depicted in FIG. 13. A typical inverse multiplier function block 1341 has a circuit similar to that of FIG. 12 in some embodiments. The inverse multiplier also supports a zero/skip output, which goes true if the digit is zero, or if the digit is marked skipped. The plurality of zero/skip outputs may be logically combined using AND gate 1381 in a basic embodiment. The output of AND gate 1380 provides a ì doneî output 1381 which is routed back to the controller not shown. In many embodiments, the first inverse multiply function block 1340 is not included, since the first digit need not be divided by itself, and is undefined after subtraction at initial load.

In the initial load cycle, the inverse multiplier of each digit processing unit, such as digit processing unit 1310, multiplies the input digit by 1, thereby loading the initial residue value subtracted by the first digit into the converter inverse multiplier 1315 which typically supports a registered store for each product result. After the initial load cycle, on each successive clock, the counter 1375 indexes each digit LUT 1200 of FIG. 12, each digit LUT 1200 producing a multiplicative inverse for the selected modulus. On each clock, the inverse multiplier 1315 divides the residue value by the selected modulus. The resulting product value is generally stored and made available to the subtract units for the next conversion cycle using a digit feedback path, such as feedback path 1351 and selector 1355. After a value has been divided by a selected modulus, the associated digit of the specified divisor modulus is no longer valid, and is marked as skipped. A control unit, not shown, selects each digit and associated modulus in succession for subtraction and then subsequent division, in coordination with the modulus counter 1375 which indexes the divisor modulus. When the remaining residue value, which exists in the non-skipped digits, goes to zero, the conversion terminates. The conversion may also terminate when all digits are processed, i.e., skipped.

The residue digit subtracted may be output via digit crossbar 1370 in some embodiments. Therefore, digit crossbar 1370 outputs a mixed radix digit on each cycle of conversion. This crossbar output is shown on converter unit 610 and 620 as output bus 612 and 622 respectively in FIG. 6A. The zero flag is also shown coming from each converter unit 610 and 620 of FIG. 3. The zero flag is made available to control logic to determine end of conversion. If a value during mixed radix conversion terminates before its complement, that values data path is used as the final output of bus selector 655 of FIG. 6A. Otherwise, a comparator state embedded in control unit 615, representing the comparison of the initial non-normalized value 600 and its complement 602, is used to determine which value is less in absolute magnitude. FIG. 6A illustrates a control block 615 providing a detection of both sign and round-up of the final result through the use of a successive digit comparison mechanism not shown. All digit comparison is performed least significant digit first due to the nature of mixed radix conversion.

The residue multiplier of FIG. 6A illustrates the function of the mixed radix conversion unit 610. The output of residue to mixed radix conversion unit 610 is connected to a special power term multiplier unit 630. The power term multiplier 630 takes a mixed radix digit output from the converter 610, and multiplies the digit by its associated power, and then sums the resulting product to a running product summation contained in multiplier unit 630. These calculations are performed in residue format. The source of the i basei power terms is provided by a power terms source units 605, 625. The power term units 605, 625 may be the same in some embodiments. In one embodiment, the power term source 605 may consist of values pre-stored in a LUT or FIFO, or the power terms source 605 may be generated in real time by a residue arithmetic circuit, or other source which can provide the associated mixed radix digit power value in residue format.

Figure 14:
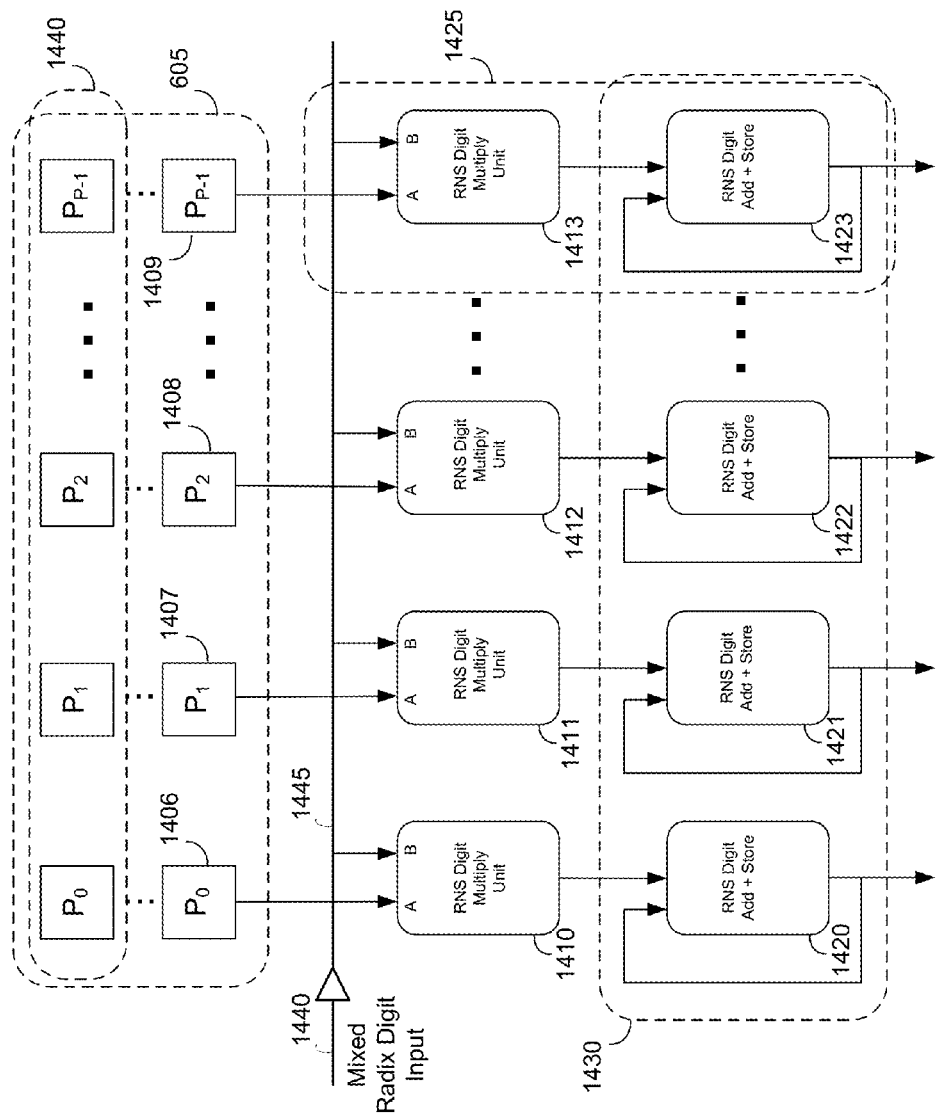
FIG. 14 is a block diagram illustrating a mixed radix digit, power term multiplier unit with power term source.

The P digit power term multiplier 630 of FIG. 6A is shown in more detail in FIG. 14. FIG. 14 also includes a power terms source 605, which sources a power term value to the power term multiplier 630 of FIG. 6A on each multiply cycle. In FIG. 14, a power term constant, such as power term constant 1440, is stored in a plurality of residue digit storage registers, such as storage registers 1406, 1407, 1408, 1409, is routed to one input of a residue multiplier consisting of a plurality of modular digit multipliers, such as digit multipliers 1410, 1411, 1412, 1413. The other input to the multiplier is sourced from the mixed radix digit value input via input 1140 which feeds the mixed radix digit crossbar 1145. This input is the connected to the mixed radix digit output 1370 of FIG. 13. Therefore, on each clock cycle, an associated power term constant is multiplied by its respective mixed radix digit, thereby creating a weighted value output from the digit multipliers.

The power term constants 605 may be pre-stored using a LUT memory, or a FIFO shift memory, for example; alternatively, an arithmetic circuit may sequentially generate the required power term constants using a smaller table of stored modulus values. Generating modulus values using an arithmetic circuit has the added flexibility of producing power term constants with arbitrarily skipped modulus. This approach allows the multiply unit of FIG. 6A to normalize products with skipped digits, or to multiply operands with arbitrary or dynamically selected digit modulus.

The product of the mixed radix digit and its respective power term constant is then summed by a residue adder and accumulator register 1430, shown as a plurality of digit add and accumulate units 1420, 1421, 1422, 1423 in FIG. 14. The digit add unit 1430 includes an accumulator function which state may be cleared prior to mixed radix conversion; FIG. 9 shows a more detailed diagram of a modular digit add and accumulator unit, such as add and accumulate unit 1420 of FIG. 14. At startup, the digit adder 1420 may clear its accumulator register 930 as shown in FIG. 9, and will therefore sum the first weighted value generated by the digit multiply units with zero. This effectively loads the first weighted digit product term into the accumulator for the next add cycle. In the next and following cycles, each weighted product term generated will be summed to the running total contained in the accumulator 1430. This process continues for all digits in parallel until the conversion is complete.

Any suitable modular add and accumulate circuitry may be used, including LUTs. The modular add circuitry of FIG. 9 uses conventional binary adder 905 and binary subtract 910 and a bus selector 920 which steers the correct value based on the state of the borrow out signal 912 of the subtract unit 910 as explained previously.

After the mixed radix conversion is complete, and the last mixed radix digit is multiplied by its power term (weight) and summed within the residue add and accumulate unit 1430, a resulting sum of products value is contained in the digit accumulator registers 1420, 1421, 1422, 1423. For the proper operation of the fractional multiplier of FIG. 6A, the sum of products representing the converted final result does not include any direct contribution from mixed radix digits associated with the fractional range. for example, fractional digits are the first F number of digits converted to mixed radix in one embodiment. These digits are not directly processed by the digit multiplier 630, and thus, their weighted value has no direct contribution to the summation (re-converted result). However, it should be noted that the fractional digits are included in the mixed radix conversion process. In fact, it is important that during conversion of the intermediate product 600 and the complement of the intermediate product 602, that the digit modulus associated with the fractional residue digits are converted first. This provides the needed division by the fractional rage, which is associated to the product of all fractional digit modulus.

In FIG. 6A, a suitable controller, not shown, contains the code and control flow to ensure that the first F digits converted by the mixed radix converter 610 are not processed by the digit multiplier 630. Therefore, in some embodiments, power term constants (weights) for each of the digits associated to the fractional range, such as constant 1440 of FIG. 14, are not stored in the power terms source unit 605. Further concepts relating to the matter of skipping, and/or truncating mixed radix digits associated with the fractional range are disclosed in more detail in U.S. Patent Publication No. 2013/0311532.

The power term multiplier 630 outputs the summation result to the round-up unit 635 in FIG. 6A. The round-up unit 635 may exist as a separate unit as shown, or may be combined into the power term multiplier unit 630. (For example, during the initial clearing cycle, the accumulator may be set to one if rounding is required.) For this example, a separate round-up unit is shown separately in FIG. 6A. The round up unit 635 consists of a plurality of modular digit adders, with one adder input tied to a selector which may select either one or zero. The other adder input is the summation value input from the power term multiplier 630. Typically, if rounding up is required, a single unit value is added to the final summation output of the residue add and accumulate unit 630, otherwise, a value of zero is added and the result is output.

Therefore, while the first F (fractional) digits do not directly affect the product summation, it may affect whether a round-up correction is made. During mixed radix conversion by Residue to Mixed Radix unit 610, mixed radix digits are sent to the sign and round up detect unit 615 as shown in FIG. 6A. This unit is capable of comparing, digit by digit, whether the mixed radix value represented by the first F digits is greater than or equal to a pre-determined round-up threshold amount, i.e., such as 50% of the fractional range magnitude. If the final converted value requires rounding, a signal is sent from the round up detect unit 615 to the round up unit 635 to perform a round up on the summation value. If not, the round-up unit 635 outputs the input value unaltered. The value is then routed to bus selector unit 655 of FIG. 6A. Bus selector 655 will route the value to the final answer output 660 if the starting value 600 is positive, and hence smaller in magnitude than its complement value processed by mixed radix converter 620. The final fractional multiplier result 660 is therefore a normalized positive fractional final product value.

As seen in FIG. 6A, the mixed radix converter 620 accepts the complement of the starting value 600 using complement unit 602. In one embodiment, the mixed radix converter 610 executes in tandem with the mixed radix converter 620. Both converters generate a mixed radix digit of the same significance (digit position) on each clock cycle. Since the values processed are complements, one value is larger than the other in magnitude. The sign and round up detect circuit 615 may detect which value converted is the smaller value in magnitude. If the smaller value is the complemented value 602, this means the starting intermediate product was negative, and the value processed by converter 620 is therefore used. As before, converter 620 sends mixed radix digits to a power term multiplier unit 640, which multiplies the mixed radix digit value by its power term constant, or weight. The power term constants are stored in a power terms source 625. Each non-fractional digit processed adds another product sum to a running summation contained in the mixed radix digit, power term multiplier unit 640 as discussed previously.

After reconversion of the value back to residue format by the power term multiplier and accumulator 640, the output may be rounded up by round up unit 645. Unlike before, the value is then complemented by complement unit 650, since the value processed is positive, and therefore must be re-converted to a negative quantity for a final result. During this time, regardless of the data path chosen, the sign flags, not shown, may be updated to reflect the proper sign, and the sign valid flags set true. Sign flags and sign valid flags are discussed in U.S. Patent Publication No. 2013/0311532.

The sign and round-up detect unit 615 determines if the original value or its complement is smaller in magnitude; it performs this comparison least significant digit first during conversion to mixed radix format. The sign and round-up detect unit 615 compares each mixed radix digit, digit by digit, during the synchronized conversion process. If a value under conversion terminates before another, that value is deemed smaller in magnitude. Also, if both converters terminate in the same cycle, the sign detect unit 615 can determine, based on the value of digits compared, which value is smaller in magnitude. Once detected, the sign detect unit 615 sends a signal to the select input of the bus selector 655. In this embodiment, the fractional multiplier of FIG. 6A routes the correct answer to the output 660, and furthermore, generates a valid sign flag for the resultant value.

In one embodiment, the residue to mixed radix conversion units 610, 620 processes digit modulus from smallest to largest. This allows that every digit function unit only process digits within their specific legal range. For example, during subtraction of the digit value of the first modulus, its range is smaller than all other digit modulus; during subsequent processing of each successive digit, the same holds true. Therefore, the digit subtract unit of each digit processing unit of the residue to mixed radix converter, such as digit processing unit 1310 of FIG. 13, need only support a single range modular subtract unit 1333, using circuitry similar to that shown in FIG. 8.

Figure 6B:
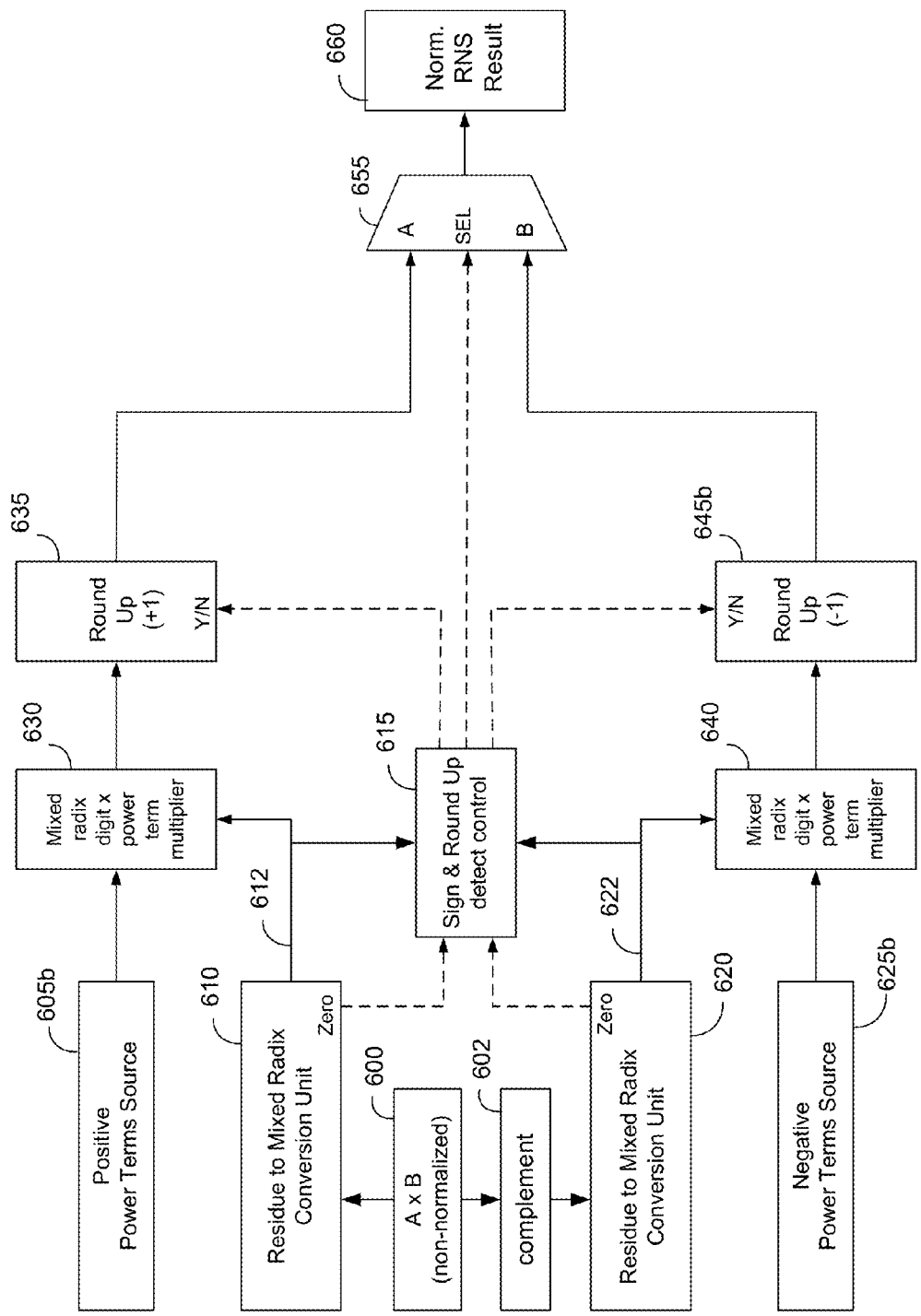
FIG. 6B is a block diagram illustrating a fast residue multiply and normalization apparatus for use as a fractional residue multiplier apparatus.

To illustrate one of the many variations of the fractional multiply method of the present invention, FIG. 6B is presented. In FIG. 6B, the identical apparatus as FIG. 6A is shown with several minor modifications. In FIG. 6A, two identical power terms sources 605, 625 are illustrated. In FIG. 6B, the power terms source 625b associated with the processing of the complement of the intermediate product 602 is modified to store a plurality of negative power terms, or pre-complemented power terms. The power terms source 605b of FIG. 6B contains the original positive power terms, while the power terms source 625b contains the complement of the original power terms, which is also referred to as negative power terms source 625b. Lastly, the round-up unit 645b is actually a decrement operation, since adding a negative one is subtracting by one.

Therefore, during the processing of the complement of the intermediate product 602, the mixed radix digit, power term multiplier 640 multiplies a positive mixed radix digit with a negative power term value. This arrangement provides an apparatus where the mixed radix digit, power term multiplier 640 sums only negative weighted digit values. Therefore, the final resulting product sum of the power term multiplier 640 is already complemented, and there is no need for an extra complement step, such as complement step 650 of FIG. 6A. This arrangement saves a complement unit and a single clock cycle for the processing of negative fractional products. It also helps to make the fractional multiplier of FIG. 6B symmetrical in terms of timing regardless of the sign of the final fractional product result.

The following section presents a detailed operation of the fractional residue multiplier of the present invention by means of example. In this example, the same fractional problem presented in U.S. Patent Publication No. 2013/0311532, FIG. 15G, is presented for means of clear comparison, and this FIG. 15G is re-labeled FIG. 15 in the present disclosure. In the present example, the sample fractional value calculation is summarized within the dotted rectangle 1551 of FIG. 15. Of particular significance is the disclosure of the fractional format used in the present example, which may be deduced by examination of FIG. 15. In particular, the fractional format uses 18 distinct prime modulus, starting with the modulus M=2, and including every prime modulus up to modulus M=61.

The specific fractional range 1801 of the fractional representation of the present example is disclosed in FIG. 18, and is based on the first seven primes, starting with $M_0=2$ and ending with $M_6=17$ inclusive. A whole number range, or integer range 1802, is formed using the next four primes, $M_7=19$ thru $M_{10}=31$, and an extended range 1803 is formed using the remainder of the modulus $M_{11}=37$ thru $M_{17}=61$. A thorough description of the fractional format used in the present invention can be found in U.S. Patent Publication No. 2013/0311532.

Figure 16:
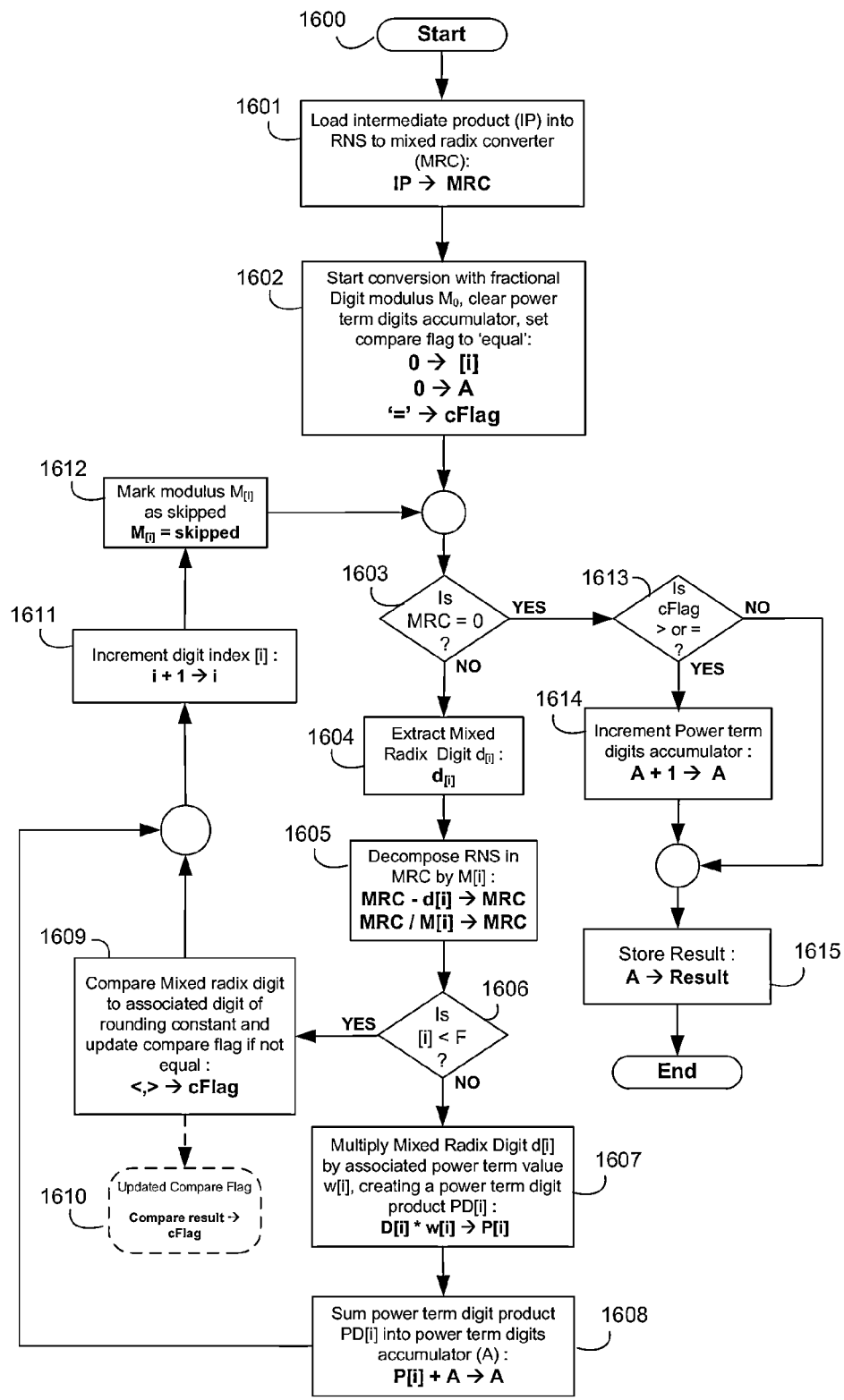
FIG. 16 is a flow control diagram illustrating the control steps of a fractional residue multiplier apparatus.

In FIG. 16, a control unit flow diagram is provided to illustrate the processing steps taken by the fractional multiplier of the present invention. The control flow will emphasize the apparatus of FIG. 6A over that of FIG. 6B for means of clarity. As mentioned earlier, the present invention does not disclose details of the control circuitry required to operate and sequence the apparatus of FIG. 6A, however, such control circuitry is well known to those skilled in the art. However, the flow diagram of FIG. 16 is also used to help describe the operation of the fractional multiplier of the present fractional multiply example which follows.

FIG. 17 is provided to clarify the contents and formation of power terms contained within the power terms sources 605, 625 of FIG. 6A. Additionally, the pictorial table of FIG. 17 helps clarify various associations of the structure and operation of the power terms source with respect to the operation of the fractional multiplier of the present invention and example. In the present example, the power terms sources 605, 625 are assumed to implemented using a memory LUT.

Figure 19:
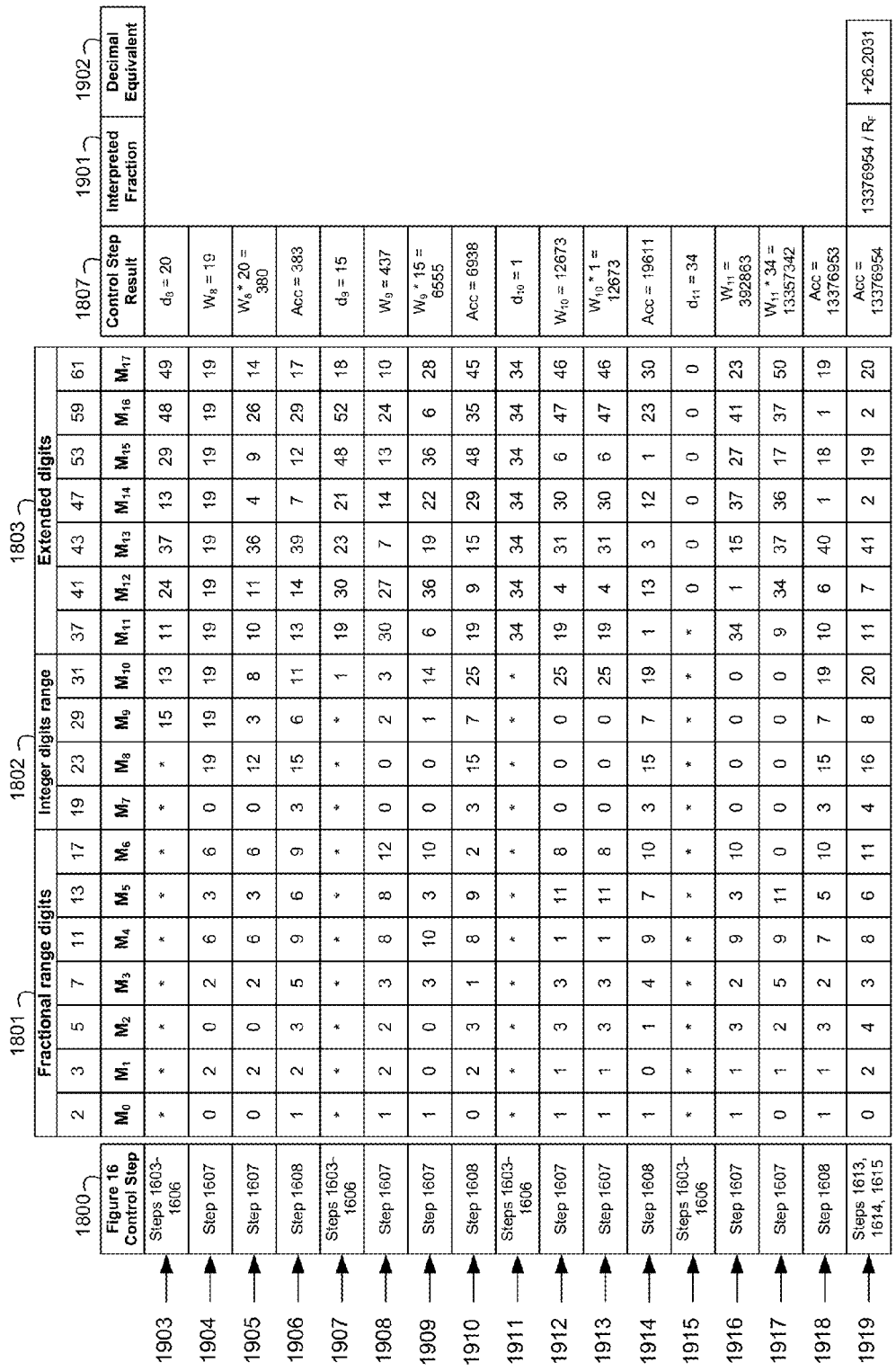
FIG. 19 is an example fractional residue multiplication computation illustrating intermediate residue values and states.

FIG. 18 and FIG. 19 are provided to illustrate the intermediate residue values of the example fractional multiply calculation in a digit by digit fashion. Associated with the residue intermediate values in FIG. 18 and FIG. 19 are the specific control steps of the flow control sequence of FIG. 16. The example provided will focus on the multiplication of two positive fractional values in RNS fractional format. Multiplication of negative values use the opposite data path of FIG. 6A, and is similar to the flow described for positive results with the exception of two complement units 602, 650.

Starting with the flow diagram of FIG. 16 and the multiplier apparatus of FIG. 6A, the intermediate product (IP) is loaded into the mixed radix converter 610 in control step 1601. This step is also shown in FIG. 18, row 1808 which shows the actual starting intermediate product residue value. It should be noted that the intermediate product is the integer product of the two fractional operands A and B which is shown in FIG. 15.

This initial integer multiply operation is typically considered part of the fractional multiply method, but has been left out of the control flow diagram of FIG. 16. In this case, FIG. 16 may be more concisely described as a normalization flow control sequence, which is a more general procedure, and may be used to process an intermediate product sum value, for example.

In this example, operand A is the value 8.0625 as is shown in row 1556 of FIG. 15, and operand B is the value 3.25 as shown in row 1557 of FIG. 15. The integer product of these operands is shown in row 1558 of FIG. 15, and is also repeated in FIG. 18, row 1808. Note that the digit modulus are shown in opposite order in FIG. 18 versus FIG. 15. In control step 1602 of FIG. 16, additional initialization takes place; the modulus index, [i], is cleared, and the accumulator section of each mixed radix digit, power term multiplier 630, 640 of FIG. 6A is cleared. Also, the rounding comparator initial state flag "cFlag" is assigned as 'equal' initially. Note that in the example given, certain conventions are made. In particular, the modulus associated with the fractional residue digits, $M_0$ thru $M_6$, and hence the fractional range, $R_F$, are the first modulus to be divided out by the residue to mixed radix converters 610, 620. Therefore, the modulus associated with the fractional digits are numbered with the index [i] starting with zero.

In the next control step 1603 of FIG. 16, a determination is made to whether either mixed radix converter contains a zero value. If not, the flow control proceeds to step 1604 which conveys the fact that the indexed modulus digit is stored, or at least transmitted to the mixed radix digit, power term multiplier 630 of FIG. 6A. This digit is in effect the generated mixed radix digit, d[i], output via bus 612, 622 of FIG. 6A. In the next control step 1606, the generated digit d[i] is subtracted from the entire RNS word contained in the residue to mixed radix converter 610, 622 of FIG. 6A. Also, the entire residue value is also divided by the indexed modulus M[i]; this is performed using a multiply by the multiplicative inverse of the indexed modulus in one embodiment, as discussed earlier using the apparatus of FIG. 13 having a plurality of digit processing units similar to FIG. 12. Next, in control step 1606 of FIG. 16, a comparison or check is made to determine if the index is within the fractional digit range, and if so, flow control proceeds to control step 1609, where the generated digit d[i] is compared against a rounding constant in mixed radix format. If the comparison is not equal, the state of the cFlag is updated to reflect the result of the digit comparison.

Proceeding forward to control step 1611, the index [i] is incremented to anticipate the access and processing of the next modulus and digit position of the residue number under decomposition within the residue to mixed radix converter 610, 620 of FIG. 6A. These aforementioned steps produce a new residue value in the residue to mixed radix converter, and this resulting value is shown in FIG. 18, row 1809 by means of our example. Note that in FIG. 18, row 1809, the $M_0$ modulus digit position is shown with an asterisk, since the first modulus $M_0$ and its associated digit is now undefined, hence it is skipped as is shown in control step 1612 of FIG. 16.

The process above is quite fast, and may be accomplished in one or two clock cycles in many embodiments. The above process is repeated for each and every modulus associated with the fractional range unless the residue value terminates in a zero value before that time. If so, unless the converted value is originally zero, or greater than the rounding constant, the final result will be an underflow. This type of result may generate an exception, or error, and is not shown in the control sequence of FIG. 16 for sake of clarity. In our example problem, the afore-mentioned process forms a loop, which is repeated for each additional fractional modulus $M_1$ thru $M_6$ of our example. In our example, this is illustrated in FIG. 18, rows 1810 thru 1815.

When all residue digits associated with the fractional range have been converted, and assuming the remaining non-skipped residue digits under decomposition are not all equal to zero, control is passed to control step 1603, 1604, 1605 of FIG. 16, and then on to control step 1607. This sequence of steps begins the conversion of residue digits not associated to the fractional range 1801 of FIG. 18. In control step 1607, the generated mixed radix digit d[i] is not associated with the fractional range, and is therefore sent to the mixed radix digit, power term multiplier 630, 640 of FIG. 6A via data paths 612, 622 respectively. In the next control step 1608, the generated mixed radix digit d[i] is multiplied by its respective power term, or digit weight. For the very first non-fractional digit, this weight is equal to the value one, as shown in FIG. 1700, row 1711. The product of the digit and the value one is of course the value of the digit itself, and this product is summed to the value contained in the add and accumulate unit 1430 of FIG. 14, which was cleared in control step 1602 of FIG. 16. In FIG. 16, control is again passed to control step 1611 and control step 1612 to increment the modulus index, and to skip the digit just processed. This process flow forms a loop which results in a residue value stored in the accumulator section 1430 of the mixed radix digit, power term multiplier of FIG. 14. Note that the proper power term is always indexed within the power term source 1440 in this process. This index may be the same index [i] in some embodiments.

The above process forms a control loop which processes the first non-fractional residue digit d[7] in our example, and the relevant values generated during this process are shown in FIG. 18, rows 1816 thru 1819. The control loop for non-fractional digits repeats until one of the residue values contained in either mixed radix converter unit 610, 620 goes to zero. In our example, there are four additional digits generated that are processed using the same control loop procedure, except with different power term values as shown in FIG. 19, rows 1903 thru 1918. At the end of the last non-fractional digit processing loop, the accumulator of the mixed radix digit, power term multiplier 630 contains the value 13376953 as shown FIG. 19, row 1919. Because our example uses positive values, the intermediate product associated with the product of our two initial operands A and B terminates before its complement, hence the comparison of the two decomposing IP values causes the control apparatus 615 of FIG. 6A to choose the upper data paths of the multiplier apparatus of FIG. 6A.

Furthermore, during the comparison of the fractionally associated mixed radix digits to the rounding constant c[i] of column 1806 of FIG. 18, the last generated fractional digit d[6] is greater than the rounding constant digit c[6], so the cFlag of control step 1609 of FIG. 16 is set to "greater than" (>) in FIG. 18, row 1815, and this specifies that a round up is required; this fact is determined in control step 1613 of FIG. 16. It should be noted that the cFlag of the comparison step 1609 may be generated not by a direct compare of two digits d[i] and c[i], but may be set by an early termination of one intermediate residue product over the other. In other words, if a residue value under decomposition by a residue to mixed radix converter 610, 620 of FIG. 6A terminates before the other, i.e., its residue value goes to zero one or more digit positions earlier, then that value is deemed less in magnitude than the other. This slight complication is not specifically noted in the control flow of FIG. 16, yet this condition may be a common occurrence.

In FIG. 19, row 1918, the accumulator of the mixed radix digit, power term multiplier 630 is sent to the round-up unit 635 in FIG. 6A. Because the cFlag is set "greater than" as noted above, the recomposed residue value from the accumulator section is incremented by one, thereby constituting a round up operation. In FIG. 19, row 1919, the final value is interpreted to be exactly the same result as that obtained in FIG. 15 using the method of mixed radix digit truncation of U.S. Patent Publication No. 2013/0311532, and re-printed as FIG. 15.

In summary, the example demonstrates the improved fractional multiply method of the present invention, which essentially starts the residue re-composition process in parallel to the residue decomposition process, and this saves additional clock cycles in many embodiments.

B. Multiplier Method and Apparatus 2

The second claimed fractional residue multiplier achieves lower latency at the cost of additional parallel processing. The new method follows a different algorithm for fractional residue multiply then the previous disclosure. We will explain the basic algorithm first; next, we will show how the algorithm is applied to residue fractions and processed by the disclosed apparatus.

If we consider the multiplication of two fractional numbers, we can write the operation as:

$$w_r.f_r = w_1.f_1 * w_2.f_2 \quad \text{(eq. 1)}$$

In equation 1, each fractional number is represented by a whole part, w, and a fractional part, f. We can also write a fractional value as the sum of its whole part and its fractional part:

$$w.f = w.0 + 0.f$$

Therefore, we can re-write equation 1 as:

$$w_r.f_r = (w_1+f_1)*(w_2+f_2) = w_1 w_2 + w_1 f_2 + w_2 f_1 + f_1 f_2 \quad \text{(eq. 2)}$$

From equation 2, we have an integer operation, $w_1*w_2$, which in residue executes in two clocks including scaling by the fractional range. Two terms, $w_1 f_2$ & $w_2 f_1$, which is a fraction multiplied by an integer, executes in a single clock cycle in residue format. The last term, $f_1 f_2$, is the most problematic, as it represents a fraction times a fraction. One feature of the new multiplier is how this last term is processed in parallel to the process of separating the whole and fractional parts of each operand, $w_1.f_1$ & $w_2.f_2$.

One motivation of the new method is to trade a fractional operation for several integer operations, which are faster in residue format. In terms of processing equation 2 in residue format, it is clear the separation of the whole and fractional portions of a fractional value is an important operation. In one embodiment, mixed radix conversion is used to perform such separation. Furthermore, base extension is an issue that must be dealt with.

Figure 20:
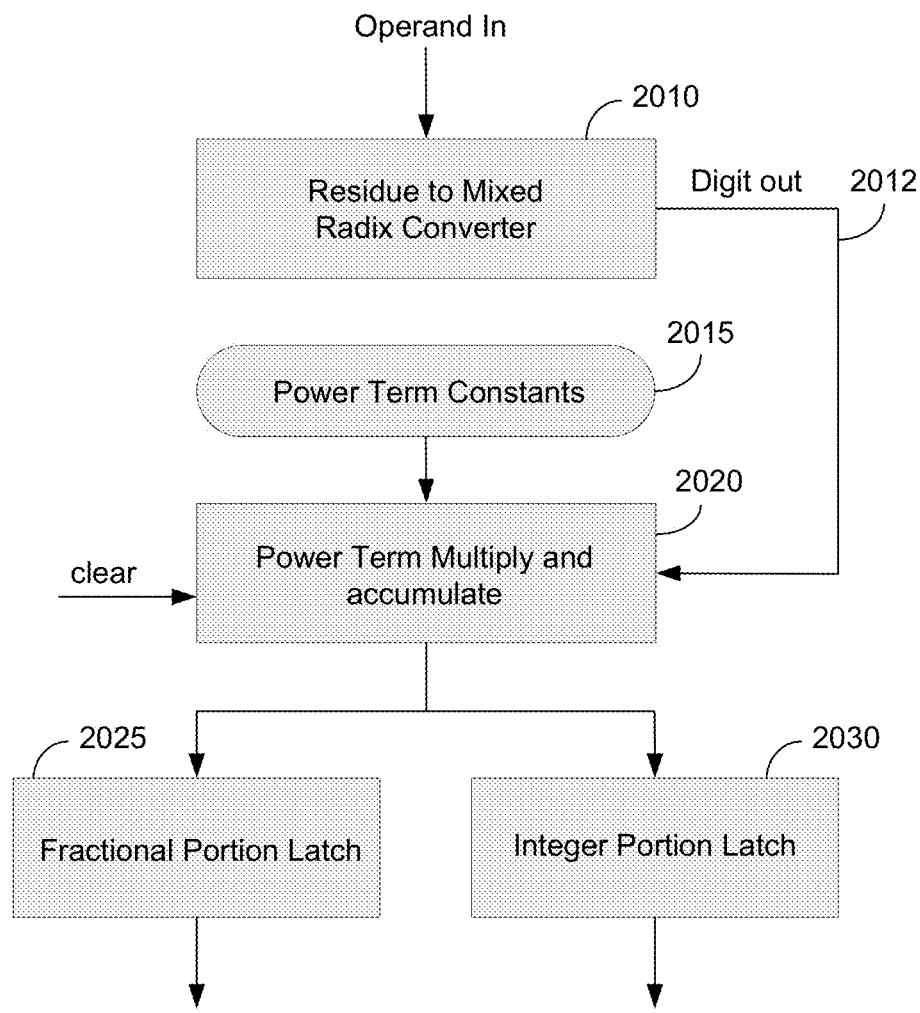
FIG. 20 is a block diagram of a fractional residue value separator unit.

FIG. 20 discloses a novel apparatus for separating a fractional residue number into its constituent fractional and whole parts. The fractional residue format for the example apparatus of FIG. 20 was introduced in U.S. Patent Publication No. 2013/0311532 and is not repeated here. In FIG. 20, a mixed radix converter unit 2010, which in one embodiment is similar to the apparatus of FIG. 13, generates a mixed radix digit on each cycle. A power term multiplier and accumulator unit 2020, which in one embodiment is similar to the apparatus of FIG. 14, receives the mixed radix digit and multiplies by its associated power term 2015, resulting in a weighted digit value. The power term multiplier and accumulator unit 2020 also includes an accumulator, which provides a means to provide a running accumulation of weighted digit values.

The mixed radix converter 2010 starts with the fractional residue digits first; after converting all fractional digits, a fractional range is converted. During the fractional range conversion, the weighted value of each digit output 2012 is summed by the power term multiply and accumulate unit 2020. Immediately after all fractional digits are converted by the mixed radix converter 2010, the power terms accumulator 2020 value is latched into the fractional portion latch 2025. Next, the power term accumulator is cleared and the mixed radix conversion continues, only now the power terms accumulator is summing weighted digits associated with the whole, or integer, range. When mixed radix conversion terminates, the residue value contained in the power term multiply and accumulator 2020 is latched into the integer portion latch 2030.

As shown in FIG. 20, the apparatus for separating a fractional residue number into its fractional and whole parts includes a power terms constants source 2015. FIG. 23 provides more detail of the power terms constants 2015 source by means of example. As shown, the power terms constants 2015 source of FIG. 23 illustrates an example structure which differs from the power terms source of FIG. 17 in that power terms for both the fractional range, and the whole integer range are provided. In FIG. 17, only power terms for the whole range is supported, since the multiplier of the previous apparatus does not accumulate weighted digits of the fractional range by design. In the current fractional residue multiplier apparatus of FIG. 21, power term constants are provided for both the fractional range, and the whole integer range of a residue fraction. The power term constants may be implemented as a memory look up table (LUT), or may be constructed using arithmetic circuits, not disclosed herein, which may dynamically calculate the required power terms constants depending on the fixed point position of a variable point position residue fraction. Variable point position residue fractions, also known as sliding point residue fractions, is disclosed in U.S. Patent Publication No. 2013/0311532 and is not repeated here.

In one embodiment, the total number of clocks required for the fractional residue value separation operation is the same as the total number of fractional and whole digits of a single operand. This is advantageous, since the number of clocks required to process the intermediate product of two residue fractional operands, i.e. in terms of converted mixed radix digits, may be double. Once the terms of equation 2 can be produced, it takes several additional clocks to scale and sum the integer and fractional portions, so in some cases, the algorithm of the present multiplier may multiply in less clock latency than the previous multiplier of the present invention. If a residue format supports both a large fractional and whole range, this new multiplier can reduce clock latency significantly. In fact, in terms of multipliers operating in a digit by digit fashion, this new apparatus may be one of the fastest procedures and methods known to date.

Figure 21:
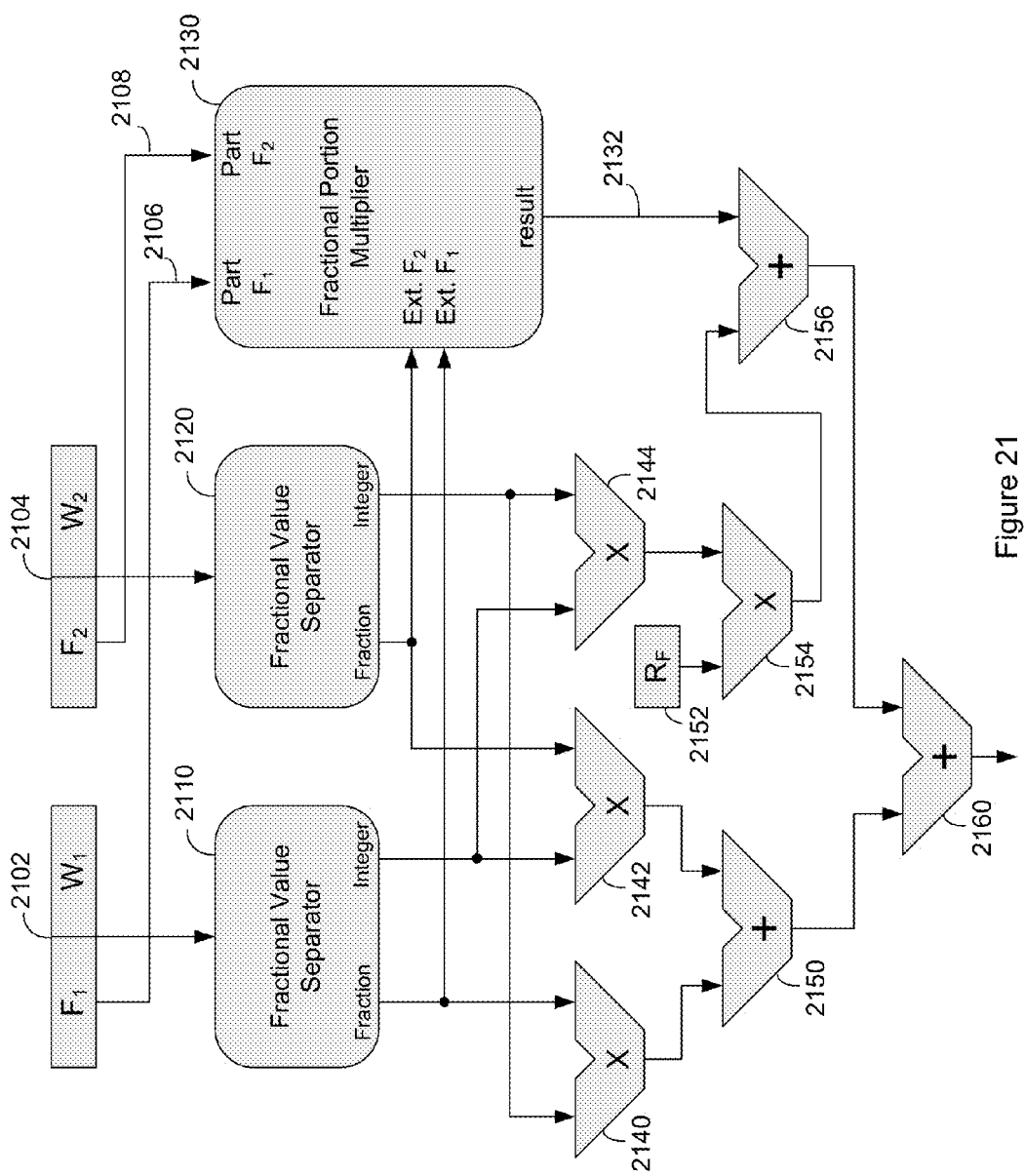
FIG. 21 is a block diagram of a fractional residue multiplier apparatus.

In order to reduce latency, the last fractional term $f_1 f_2$ of equation (2) must be processed quickly. One issue with this is that fully extended fractional values from the separators 2110, 2120 of FIG. 21 are not ready until F number of clocks, where F is the number of fractionally associated residue digits. If the apparatus is to reduce clock cycles, this leaves only another W number of clocks to complete processing of the fractional value to gain any advantage. This is difficult, since the fractional result $(f_1*f_2)$ must be fully base extended before addition of the terms of equation (2) can be finalized.

One innovative method to speed up the processing of the fractional term $(f_1*f_2)$ of equation (2) relies on the fact that it is possible to truncate the fractional digits from the operands at start, and begin early processing of the fractional product. This innovation is disclosed next.

FIG. 21 illustrates an overall block diagram of the new fractional multiplier invention. The fractional portion multiplier 2130 receives two truncated fractional values via input bus 2106 and 2108 respectively. The truncated input contains only the fractional digits, and leaves all other digits undefined, or skipped. The reason is that simple truncation of the fractional digits of an operand does not produce a fully extended fractional residue value.

Figure 22:
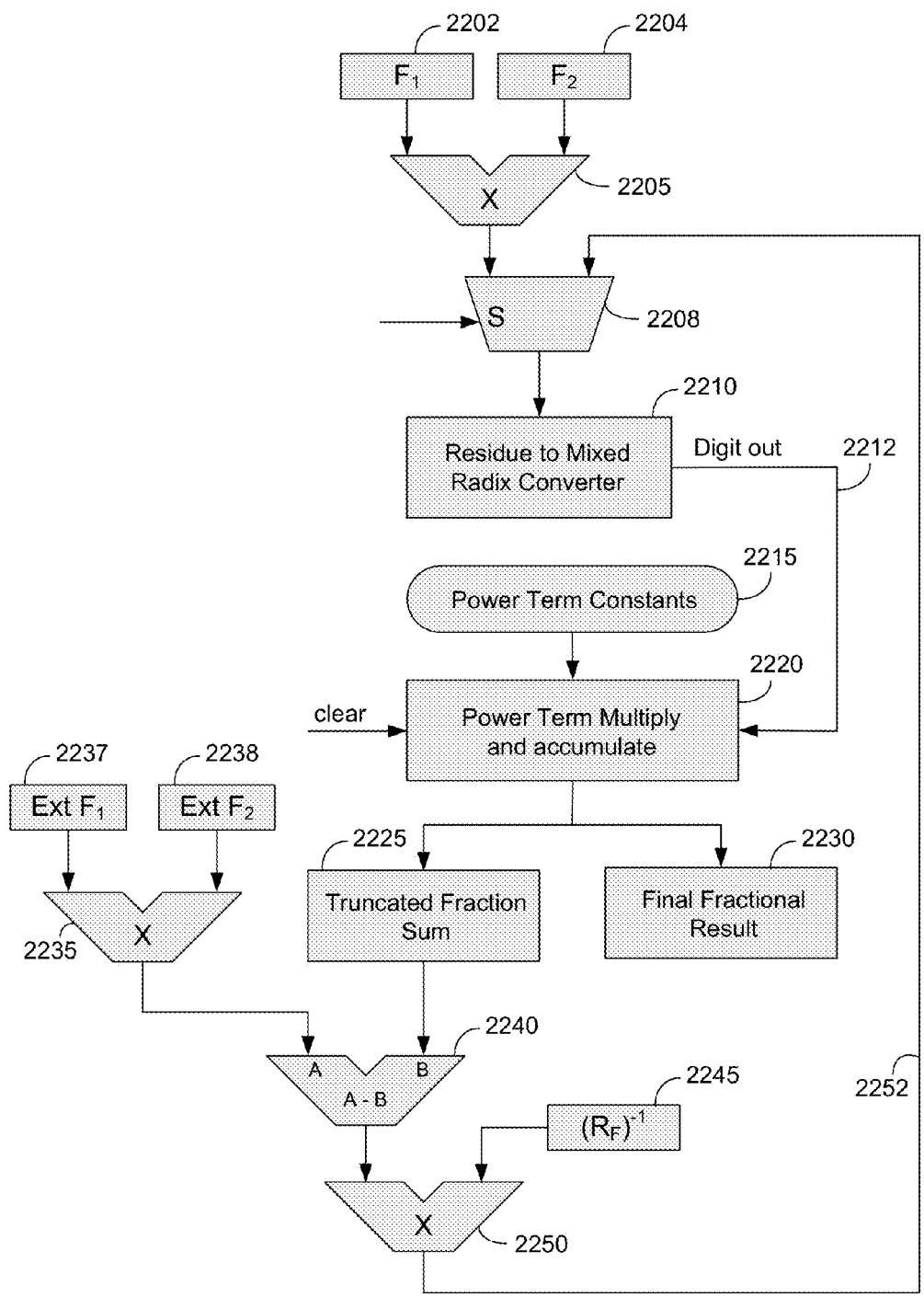
FIG. 22 is a block diagram of a fractional portion only multiplier unit.

FIG. 22 illustrates a block diagram of one embodiment of the internal components of the fractional portion multiplier 2130 of FIG. 21. In FIG. 22, a multiply of the fractional digits of operand $F_1$ and $F_2$ is performed by integer multiplier 2205. The result of multiplier 2205 results in a partially extended product which is steered by selector 2208 and then accumulated into a fully extended residue value using a residue to mixed radix converter 2210 feeding a power term multiply and accumulator unit 2220. In one embodiment, the conversion process occurs one digit at a time, and when complete, the fully extended value, representing a truncated fractional product, is stored in a truncated fraction sum latch 2225. In some other embodiments, the fully extended result by-passes latch 2225 and is routed directly to subtract unit 2240.

At about the same time the base extension process above completes, the fully extended fractional values, Ext $F_1$ 2237 and Ext $F_2$ 2238, are available from the fractional value separators 2110 and 2120 of FIG. 21. As a result, information is available to allow the undefined digits originally produced by the multiplier 2205 to essentially î catch-upî, or to be recovered, to where they would have been had they not been undefined. Mathematically speaking, the undefined digits are defined as caught up, or extended, if they assume the residue digit values which represent the fully extended product, $(f_1*f_2)$, divided by the fractional range $R_F$. The definition of the fractional range $R_F$ is the product of all fractionally associated modulus, and is further defined in U.S. Patent Publication No. 2013/0311532.

To catch-up, or extend, the undefined (whole and redundant) digits, a fully extended product $(f_1*f_2)$ of the fractional values is obtained using multiplier 2235 in FIG. 22. The source of the fully extended fractional values, Ext $F_1$ 2237 and Ext $F_2$ 2238, is via fractional value separators 2110 and 2120 of FIG. 21. These values are available F clock cycles from start. The fully extended value representing the product of the truncated fraction digits is subtracted from the fully extended product $f_1*f_2$ using residue subtract unit 2240 shown in FIG. 22. The result of subtraction unit 2240 is always a value that is evenly divisible by the fractional range $R_F$, since all fractional residue digits are zero. The resulting value is multiplied by the multiplicative inverse of the fractional range $(R_F)^{-1}$ 2245 using multiplier 2250, which occurs in a single step or clock. The resulting product of multiplier 2250 is defined for whole and redundant residue digits only (since the fractional range digits are undefined due to MODDIV by the fractional range $R_F$). The resulting whole and redundant digits represent the value of the normalized fractional portion product result $(f_1*f_2)$, but are partially base extended.

To form a completely extended normalized fractional product result, $(f_1*f_2)$, the resulting residue product value is routed to an available base extension unit. In one embodiment, the resulting digits are routed using bus 2252 to the same mixed radix unit converter 2210 using a bus selector 2208. A new accumulator sum is started by clearing the power term accumulator 2220. An associated set of power term constants are defined for this stage of conversion as shown in FIG. 23. (For example, the power term constants 2215 restart at a power of one, and progress as a running product of digit modulus values, i.e., progressively scaled by the value of each modulus processed.) The non-skipped digits are converted to mixed radix, multiplied by their associated power, and are immediately summed to a running, but fully extended, residue value within the power term multiply and accumulator 2220. The final sum represents the fully extended value of the partially extended product $f_1*f_2$ result of multiplier 2250.

When fully reconverted, the final fractional product ($f_1*f_2$) is transferred from the power term accumulator 2220 to the final fractional result latch 2230. In some embodiments, to save clock cycles, the final fractional result latch 2230 is replaced by a bus which transfers the result to the next stage of processing as indicated in FIG. 21 via bus 2132.

Returning to FIG. 21, a block diagram of one embodiment of the new multiplier is shown. Two fractional operands, represented as blocks 2102, 2104, are shown. One completely extended operand 2102 is input into fractional value separator 2110 while the other completely extended operand 2104 is input into fractional value separator 2120 at start. Also at start, fractional digits of the first and second operand are routed by bus 2106 and 2108 respectively, to one and another input of a fractional portion multiplier 2130. At F number of clocks, value separators 2110, 2120 output a fully extended fractional value to fractional portion multiplier 2130. At F+W number of clocks, both value separators 2110, 2120 output a fully extended integer value.

At this point, a plurality of integer multipliers 2140, 2142, 2144, 2154 provide the first three of the four terms of the right side of equation 2. Multipliers 2140, 2142 provide the product of an integer times a fraction. Adder 2150 performs a sum of these two terms. Multiplier 2144 provides a product of two integers, and further scales the product by the fractional range constant 2152 using multiplier 2154. At approximately this point, the final term of equation 2 appears as a result of fractional portion multiplier 2130, which is summed to the scaled whole term using adder 2156. A final adder 2160 makes the final summation to complete the processing of the right hand side of equation 2. The final fractional multiply result exits adder 2160 in FIG. 21.

Other embodiments may exist which basically accomplish the same functions as FIG. 21. For example, a single multiplier and accumulator circuit may be used in lieu of multipliers 2140, 2142, 2144 & 2154 and adders 2150, 2156 & 2160. Other variations include modifications and enhancements to the residue fractional value separator of FIG. 23. It should be clearly understood by those skilled in the art that variations to the multiplier apparatus illustrated by the block diagram of FIG. 15 are possible.

In the fractional multiplier apparatus of FIG. 21, details for implementing a suitable rounding function is not shown for clarity. However, as shown in the fractional multiplier apparatus of FIG. 6, a method for measuring the mixed radix digits associated with the fractional digits (of the IP) may be compared with a suitable rounding constant, and such a similar method may be implemented within the apparatus of FIG. 21. In particular, and referring to FIG. 22, during the mixed radix conversion (decomposition) of the fractional only product result of multiplier 2205 via the residue to mixed radix converter 2210, the generation of a sequence of mixed radix digits output 2212 may also be transmitted to a comparator and control unit not shown. A comparator and control unit, similar to control unit 615 of FIG. 6, may determine whether a round up is to be performed based upon a least significant first digit comparison to a rounding constant, similar to the rounding constant 1806 of FIG. 18. In a similar method to steps 1808 thru 1815 of FIG. 18, a comparison of mixed radix digits, or remainder value 1804, is performed against a rounding constant 1806. If the result of comparison determines the remainder value, associated to the value represented by the series of mixed radix digits 1804, then the final residue result of the residue fractional multiplier of FIG. 21 may be incremented by one unit. It should be obvious to those skilled in arithmetic circuit design that other forms and modes of rounding is possible.

FIG. 24 is included to demonstrate an example calculation using the new residue fractional multiplier of the present invention. In this example, the same numeric operands and the same residue fractional format is used as provided in the example of FIG. 15 and FIGS. 18 & 19 for means of clear comparison. In row 2407 of FIG. 24, the residue digits for operand A is shown, while in row 2408 the residue digits for operand B is shown. After performing a separation of the fraction portion from the whole, or integer portion, the fractional only portion for operand A is shown in row 2409 while the fractional only part of operand B is shown in row 2411. Because the residue value separator apparatus of FIG. 20 produce completely extended operands, the residue values in rows 2409, 2410, 2411, 2412 of FIG. 24 also show completely extended values.

In FIG. 24, row 2413 shows the multiplication, or modulo product, of the fractional digits only of operand A 2407 and operand B 2408. The remaining non-fractionally associated digits of row 2413 are shown with a dash, indicating that they are not used in this process. The fractional associated digits needed to form the product of operand A and operand B are therefore immediately available to the apparatus by a simple truncation of the fractionally associated operands A and B at start. The fractional portion multiplier of FIG. 24 then performs a base extension of the remaining digits using the residue to mixed radix converter 2210 and the power term multiply and accumulate unit 2220. The result of this base extension may be stored in the truncated fractional sum register 2225 and this result is shown as row 2414 in our example calculation. By this time, a fully extended fraction portion has been separated from each operand A and B, and their product is calculated using the residue (integer) multiplier 2235 of FIG. 22.

The difference of the fully extended truncated fraction product in register 2225 and the fully extended fraction only portions 2235 is performed using a subtract unit 2240. This difference is shown in row 2416 of FIG. 24. Note that this difference is evenly divisible by the fractional range, $R_F$, whose value is also shown in row 2417. Because of this, the remaining non-fractional digits of the fractional only product of row 2413 can be "caught up", or calculated in one step, by multiplying the difference of row 2416 to the multiplicative inverse of the fractional range (with respect to the modulus of the number system). The result of this product, performed by multiplier 2250 of FIG. 22, is shown in row 2419 of FIG. 24. Note that the multiplicative inverse has no defined digits in the fractional range, so that the product will also not have valid, or defined, fractionally associated digits.

The product of row 2419 may be base extended by using the apparatus of FIG. 22 using the feedback path 2252 and another base extension cycle. The final base extended product is then stored in the final fractional result register 2230. In this way, a fully normalized and extended fractional result, $f_1*f_2$, is calculated. This final value is shown in row 2420 of FIG. 24. In rows 2421 and 2422 are the fractional times integer terms of equation 2, and in row 2423 is the product of the whole terms of equation 2 scaled (multiplied) by the fractional range $R_F$. The final summation of these terms is accomplished using adder 2156 and adder 2160. This result is shown in the row 2424 of FIG. 24. This is the same final result of the previous multiplier examples, without the addition of one unit to account for a rounding operation.

The invention claimed is:

1. A residue converter configured to convert a fractional binary value to a fractional residue value comprising:
 an input register that receives a plurality of binary input digits, the plurality of binary input digits configured as a parallel binary input receiving a binary fractional value;
 a modulus shift register that stores a plurality of modulus values and to output each of the plurality of modulus values in sequence;
 a first plurality of digit processing units that performs one or more arithmetic operations on a plurality of binary input digits and on a sequence of modulus values, and to generate a plurality of digit values and modulus values, each digit processing unit comprising:
  a modulus operand register that receives a modulus value from a prior processing stage, and configured to send a modulus value to a succeeding processing stage;
  an additive operand register that receives a digit value from a prior processing stage;
  a digit accumulator that stores a binary digit value;
  a multiplier that multiplies the contents of said digit accumulator with the contents of said modulus operand register generating an accumulator modulus product; and
  an adder that adds said accumulator modulus product with the contents of the additive operand register, and configured to send a least significant portion of the adder result to said digit accumulator, and a most significant portion of the result to a successive processing stage; and
 a second plurality of digit processing units that receive digit values and modulus values from said first plurality of digit processing units, and to perform one or more modular arithmetic operations on a plurality of residue digits, each digit processing unit comprising:
  a residue digit register that stores a residue digit;
  a modular multiplier that receives a modulus value from an input modulus bus and a value from said residue digit register, and is sends a residue product result; and
  a modular adder that receives said residue product result, and configured to receive a digit value from an input digit value bus;
 wherein after a plurality of processing cycles, a fractional residue number equivalent to a binary fractional input is stored in the plurality of said residue digit registers.

2. The residue converter of claim 1, wherein at least one said prior processing stage is said modulus shift register, and at least one said digit processing unit configured to send a digit value and a digit weight to a second plurality of digit processing units.

3. The residue converter of claim 1, wherein the first plurality of digit processing units process numbers in binary format while the second plurality of digit processing units process digits in residue number format.

* * * * *